(12) United States Patent
Shim et al.

(10) Patent No.: US 11,979,677 B2
(45) Date of Patent: *May 7, 2024

(54) IMAGE SENSOR WITH PIXEL STRUCTURE INCLUDING FLOATING DIFFUSION AREA SHARED BY PLURALITY OF PHOTOELECTRIC CONVERSION ELEMENTS AND A SIGNAL READOUT MODE

(71) Applicant: SAMSUNG ELECTRONICS CO., LTD., Suwon-si (KR)

(72) Inventors: Eun Sub Shim, Suwon-si (KR); Kyung Ho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/180,904

(22) Filed: Mar. 9, 2023

(65) Prior Publication Data
US 2023/0224607 A1 Jul. 13, 2023

Related U.S. Application Data

(63) Continuation of application No. 17/586,892, filed on Jan. 28, 2022, now Pat. No. 11,627,277, which is a
(Continued)

(30) Foreign Application Priority Data

Apr. 5, 2019 (KR) .................. 10-2019-0040289

(51) Int. Cl.
*H04N 25/75* (2023.01)
*H01L 27/146* (2006.01)

(52) U.S. Cl.
CPC ....... *H04N 25/75* (2023.01); *H01L 27/14603* (2013.01); *H01L 27/14612* (2013.01); *H01L 27/14627* (2013.01)

(58) Field of Classification Search
CPC ........ H04N 25/75; H04N 25/13; H04N 25/42; H04N 25/44; H04N 25/778; H04N 25/59;
(Continued)

(56) References Cited

U.S. PATENT DOCUMENTS 7,714,890 B2  5/2010  Okubo et al.
8,964,079 B2  2/2015  Fukuda et al.
(Continued)

FOREIGN PATENT DOCUMENTS

JP  2013-093554 A  5/2013
JP  2018-4689 A  1/2018
(Continued)

OTHER PUBLICATIONS

Communication dated Jan. 31, 2024, issued by the Korean Intellectual Property Office in Korean Patent Application No. 10-2019-0040289.

*Primary Examiner* — Ahmed A Berhan
(74) *Attorney, Agent, or Firm* — Sughrue Mion, PLLC

(57) ABSTRACT

An image sensor is provided. The image sensor includes: a pixel array including a plurality of pixels arranged along rows and columns; and a row driver which drives the plurality of pixels for each of the rows, wherein each of the plurality of pixels includes a plurality of sub-pixels, each of the plurality of sub-pixels includes a plurality of photoelectric conversion elements sharing a floating diffusion area with each other, and a micro lens disposed to overlap the plurality of photoelectric conversion elements, a readout area is defined on the pixel array in accordance with a preset readout mode, and the row driver generates a drive signal for
(Continued)

reading out signals provided from a photoelectric conversion element included in the readout area from among the plurality of photoelectric conversion elements, and provides the drive signal to the pixel array.

20 Claims, 34 Drawing Sheets

Related U.S. Application Data continuation of application No. 16/730,420, filed on Dec. 30, 2019, now Pat. No. 11,375,148.

(58) Field of Classification Search
CPC .......... H04N 25/7013; H01L 27/14603; H01L 27/14612; H01L 27/14627; H01L 27/14641
See application file for complete search history.

(56) References Cited

U.S. PATENT DOCUMENTS

| | | | |
|---|---|---|---|
| 9,237,281 B2 | 1/2016 | Fukuda | |
| 9,288,382 B2 | 3/2016 | Fujii et al. | |
| 10,432,831 B2* | 10/2019 | Lee | G02B 5/201 |
| 10,645,320 B2* | 5/2020 | Hatakeyama | H04N 25/75 |
| 2013/0049082 A1* | 2/2013 | Kato | H01L 27/14603 |
| | | | 257/292 |
| 2015/0103221 A1* | 4/2015 | Kimura | H04N 25/533 |
| | | | 348/308 |
| 2018/0255215 A1* | 9/2018 | Lee | H04N 23/55 |
| 2019/0082131 A1* | 3/2019 | Hatakeyama | H04N 25/42 |

FOREIGN PATENT DOCUMENTS

| | | |
|---|---|---|
| JP | 2018-160933 A | 10/2018 |
| KR | 10-2016-0016325 A | 2/2016 |

\* cited by examiner

IMAGE SENSOR WITH PIXEL STRUCTURE INCLUDING FLOATING DIFFUSION AREA SHARED BY PLURALITY OF PHOTOELECTRIC CONVERSION ELEMENTS AND A SIGNAL READOUT MODE

This application is a continuation application of U.S. patent application Ser. No. 17/586,892, filed Jan. 28, 2022, which is a continuation application of U.S. patent application Ser. No. 16/730,420, filed on Dec. 30, 2019, now U.S. Pat. No. 11,375,148, issued on Jun. 28, 2022, which claims priority from Korean Patent Application No. 10-2019-0040289 filed Apr. 5, 2019 in the Korean Intellectual Property Office (KIPO), the disclosures of which are incorporated herein in their entirety by reference.

BACKGROUND

1. Technical Field

Apparatuses and methods consistent with one or more exemplary embodiments relate to an image sensor.

2. Description of the Related Art

An image sensor converts an optical image into an electrical signal. With recent developments in the computer and the communication industries, there is an increased demand for image sensors with improved performance in various fields such as digital cameras, digital video cameras, smart phones and portable computers. The image sensor may be implemented as a complementary metal oxide semiconductor (CMOS) image sensor, a charge coupled device (CCD) image sensor, or the like.

SUMMARY

Aspects of the present inventive concept provide an image sensor which reads out a pixel array having a pixel structure including a plurality of photoelectric conversion elements sharing a floating diffusion area with each other.

According to an aspect of an exemplary embodiment, there is provided an image sensor including: a pixel array including a plurality of pixels arranged along rows and columns; and a row driver configured to drive the plurality of pixels for each of the rows, wherein each of the plurality of pixels includes a plurality of sub-pixels, wherein each of the plurality of sub-pixels includes a plurality of photoelectric conversion elements sharing a floating diffusion area with each other, and a micro lens disposed to overlap the plurality of photoelectric conversion elements, a readout area is defined on the pixel array in accordance with a preset readout mode, and the row driver is configured to generate a drive signal for reading out signals provided from a photoelectric conversion element included in the readout area from among the plurality of photoelectric conversion elements, and to provide the drive signal to the pixel array.

According to an aspect of another exemplary embodiment, there is provided an image sensor including: a pixel array including a plurality of pixels arranged along rows and columns; and a row driver configured to drive the plurality of pixels for each of the rows, wherein each of the plurality of pixels includes a plurality of sub-pixels, each of the plurality of sub-pixels includes a plurality of photoelectric conversion elements sharing a floating diffusion area with each other, a plurality of transmission gates for providing signals provided from the plurality of photoelectric conversion elements to the floating diffusion area, and a micro lens disposed to overlap the plurality of photoelectric conversion elements, a readout area is defined on the pixel array in accordance with a preset readout mode, and the row driver is configured to control the plurality of transmission gates to perform a readout of the signals provided from the photoelectric conversion element included in the readout area from among the plurality of photoelectric conversion elements.

However, aspects of the present inventive concept are not restricted to the ones set forth herein. The above and other aspects of the present inventive concept will become more apparent to one of ordinary skill in the art to which the present inventive concept pertains by referencing the detailed description given below.

BRIEF DESCRIPTION OF THE DRAWINGS

The above and other aspects and features will become more apparent by describing in detail exemplary embodiments with reference to the attached drawings, in which.

DETAILED DESCRIPTION

Hereinafter, various exemplary embodiments will be described with reference to the attached drawings.

Figure 1:
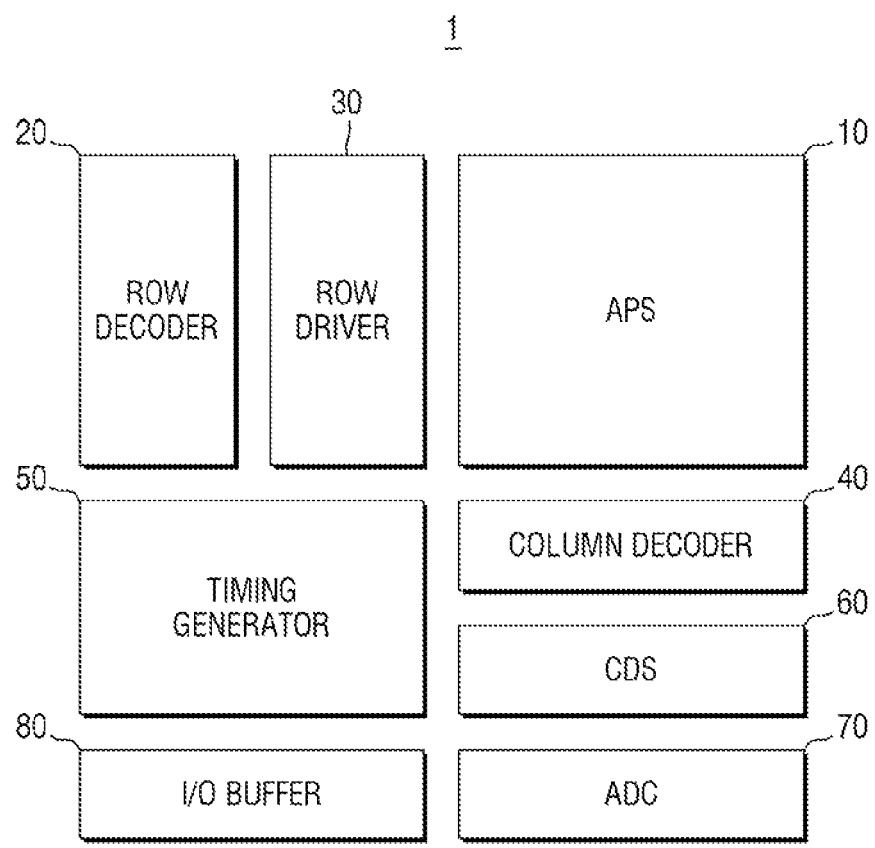
FIG. 1 is a block diagram illustrating an image sensor according to an exemplary embodiment.

FIG. 1 is a block diagram illustrating an image sensor 1 according to an exemplary embodiment.

Referring to FIG. 1, an image sensor 1 according to an exemplary embodiment converts an image of an external object into an electrical signal or a data signal. In the present exemplary embodiment, the image sensor 1 includes a pixel array or an active pixel sensor array (APS) 10, a row decoder 20, a row driver 30, a column decoder 40, a timing generator 50, a correlated double sampler (CDS) 60, an analog-to-digital converter (ADC) 70 and an input/output (I/O) buffer 80. However, it is understood that one or more other exemplary embodiments are not limited thereto, and some of the elements illustrated in FIG. 1 may be omitted, and/or elements other than the elements illustrated in FIG. 1 may be added, depending on a specific implementation purpose. For example, it is understood that at least one hardware processor may be provided to execute instructions stored, for example, in a memory to control the operations of one or more of the above-described components.

The pixel array 10 includes a plurality of pixels arranged along rows and columns, and converts light incident on the pixels into an electrical signal. The pixel array 10 may be driven by a plurality of drive signals, such as a selection signal, a reset signal, and a charge transfer signal, provided from the row decoder 20.

The row decoder 20 may provide the drive signals for each row of the pixels. Also, the electrical signal converted by the pixel array 10 in response to the drive signals is provided to the correlated double sampler 60.

The row driver 30 provides a plurality of drive signals for driving a plurality of pixels to the pixel array 10 in accordance with the results decoded by the row decoder 20. If the pixels are arranged in the form of a matrix, the drive signals may be provided for each row.

The timing generator 50 controls the row decoder 20, the column decoder 40, the correlated double sampler 60, the analog-to-digital converter 70, and the I/O buffer 80, and may supply their operations with control signals such as a clock signal and a timing control signal. The timing generator 50 may include a logic control circuit, a phase lock loop (PLL) circuit, a timing control circuit, a communication interface circuit and the like.

The correlated double sampler 60 receives, holds and samples the electrical signals generated by the pixel array 10. The correlated double sampler 60 doubly samples a specific noise level and a signal level due to the electrical signal, and outputs a difference level corresponding to a difference between the noise level and the signal level.

The analog-to-digital converter 70 converts an analog signal corresponding to the difference level output from the correlated double sampler 60 into a digital signal and outputs the digital signal.

The I/O buffer 80 latches the digital signal output from the analog-to-digital converter 70, and the latched signal sequentially outputs the digital signal to a video signal processing unit (e.g., video processor) in accordance with the decoding result from the column decoder 40.

Figure 2:
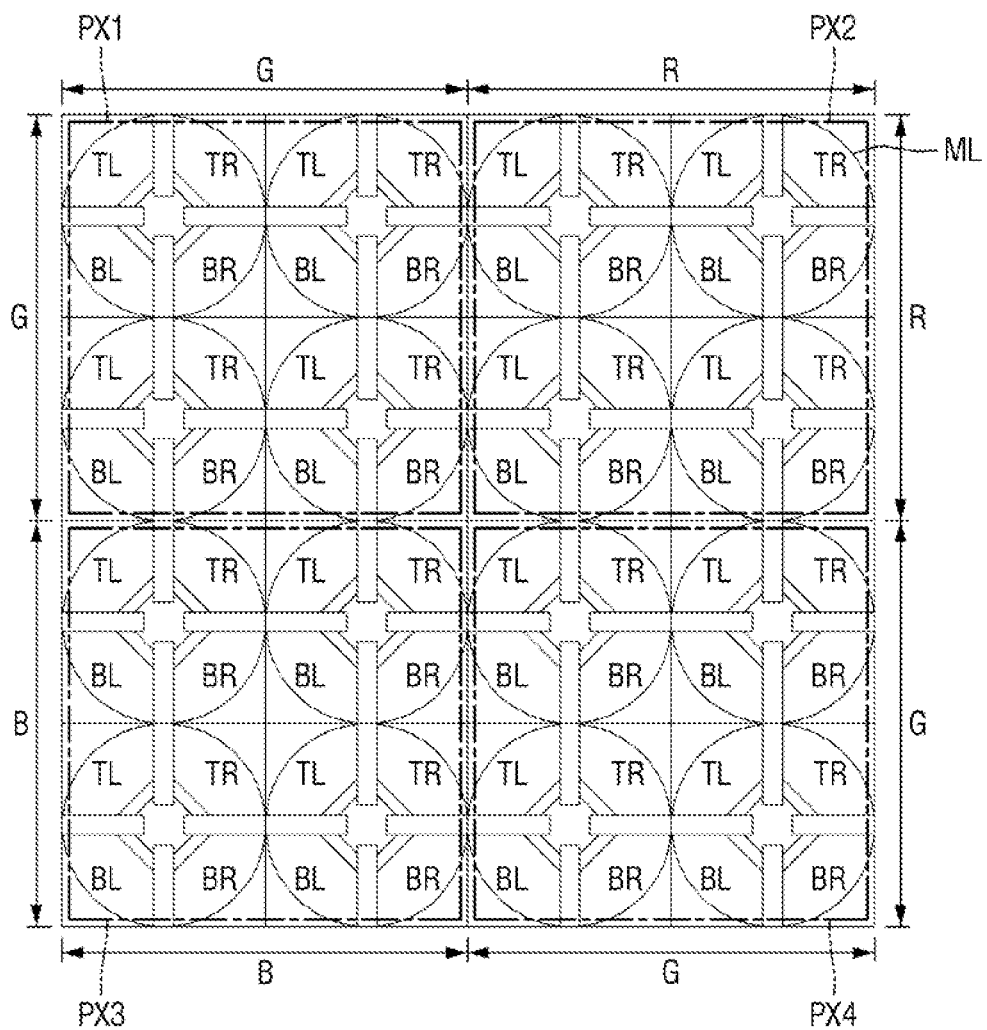
FIG. 2 is a diagram illustrating a pixel array of an image sensor according to an exemplary embodiment.
Figure 3:
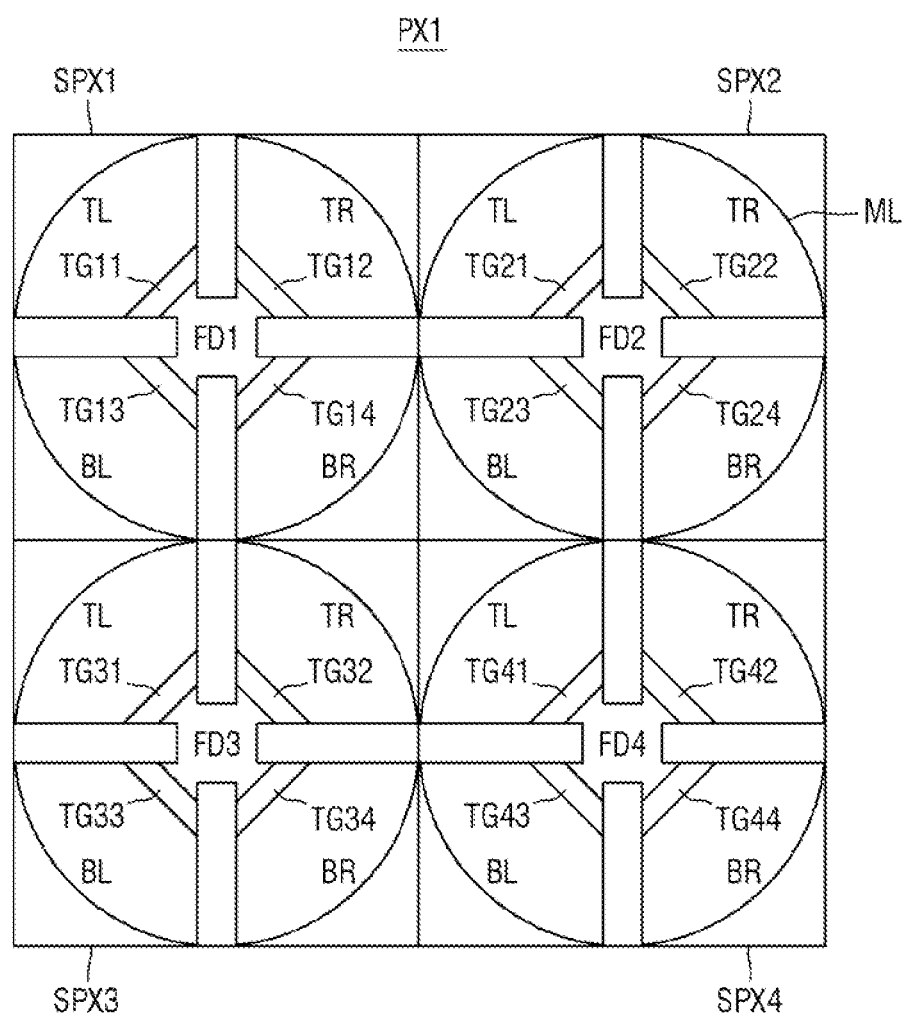
FIG. 3 is a diagram illustrating pixels defined on the pixel array of FIG. 2 according to an exemplary embodiment.

FIG. 2 is a diagram illustrating a pixel array of an image sensor 1 according to an exemplary embodiment. FIG. 3 is a diagram illustrating pixels defined on the pixel array of FIG. 2 according to an exemplary embodiment.

Referring to FIG. 2, the pixel array of the image sensor 1 according to an exemplary embodiment includes a plurality of pixels PX1 to PX4 arranged along a plurality of rows and a plurality of columns. The aforementioned row driver 30 drives the plurality of pixels PX1 to PX4 for each row.

In the present exemplary embodiment, the first pixel PX1 and the fourth pixel PX4 sense light of a green color band. On the other hand, the second pixel PX2 senses light of a red color band, and the third pixel PX3 senses light of a blue color band.

As shown in FIG. 3, each of the plurality of pixels PX1 to PX4 includes a plurality of sub-pixels SPX1 to SPX4. Each of the plurality of sub-pixels SPX1 to SPX4 includes a plurality of photoelectric conversion elements TL, TR, BL, BR.

The plurality of photoelectric conversion elements TL, TR, BL, BR may generate and accumulate charges corresponding to incident light. Although the plurality of photoelectric conversion elements TL, TR, BL, BR may be, for example, a photo diode, a photo transistor, a photo gate, a pinned photo diode (PPD), or a combination thereof, it is understood that one or more other exemplary embodiments are not limited thereto.

The first pixel PX1 may include four sub-pixels SPX1 to SPX4. Specifically, in the first pixel PX1, a first sub-pixel SPX1 may be disposed in the first row and the first column, a second sub-pixel SPX2 may be disposed in the first row and the second column, a third sub-pixel SPX3 may be disposed in the second row and the first column, and a fourth sub-pixel SPX4 may be disposed in the second row and the second column. The second pixel PX2, the third pixel PX3 and the fourth pixel PX4 may also include four sub-pixels SPX1 and SPX4 arranged in a similar structure.

Meanwhile, the first sub-pixel SPX1 may include four photoelectric conversion elements TL, TR, BL, BR. Specifically, the first photoelectric conversion element TL may be disposed on an upper left side in the first sub-pixel SPX1, the second photoelectric conversion element TR may be disposed on an upper right side in the first sub-pixel SPX1, the third photoelectric conversion element BL may be disposed on a lower left side in the first sub-pixel SPX1, and the fourth photoelectric conversion element BR may be disposed on a lower right side in the first sub-pixel SPX1. The second sub-pixel SPX2, the third sub-pixel SPX3 and the fourth sub-pixel SPX4 may also include four photoelectric conversion elements TL, TR, BL, BR arranged in a similar structure.

In the present exemplary embodiment, electrical signals generated from the four photoelectric conversion elements TL, TR, BL, BR of the first sub-pixel SPX1 are applied to a first floating diffusion area FD1, and the electrical signals may be converted into image data which, for example, may be displayed on a display device. That is, the four photoelectric conversion elements TL, TR, BL, BR of the first sub-pixel SPX1, that is, the first photoelectric conversion element TL, the second photoelectric conversion element TR, the third photoelectric conversion element BL and the fourth photoelectric conversion element BR, may share the first floating diffusion area FD1 with each other. In addition, the first sub-pixel SPX1 may include a first transmission gate TG11, a second transmission gate TG12, a third transmission gate TG13 and a fourth transmission gate TG14 that provide the first floating diffusion area FD1 with the signals provided from the first to fourth photoelectric conversion elements TL, TR, BL, BR.

Similarly, the second sub-pixel SPX2 may include a fifth photoelectric conversion element TL, a sixth photoelectric conversion element TR, a seventh photoelectric conversion element BL, and an eighth photoelectric conversion element BR that share a second floating diffusion area FD2. Further, the second sub-pixel SPX2 may include a fifth transmission gate TG21, a sixth transmission gate TG22, a seventh transmission gate TG23 and an eighth transmission gate TG24 that provide the second floating diffusion area FD2 with the signals provided from the fifth to eighth photoelectric conversion elements TL, TR, BL, BR.

Similarly, the third sub-pixel SPX3 may include a ninth photoelectric conversion element TL, a tenth photoelectric conversion element TR, an eleventh photoelectric conversion element BL and a twelfth photoelectric conversion element BR that share a third floating diffusion area FD3. Further, the third sub-pixel SPX3 may include a ninth transmission gate TG31, a tenth transmission gate TG32, an eleventh transmission gate TG33, and a twelfth transmission gate TG34 that provide the third floating diffusion area FD3 with the signals provided from the ninth to twelfth photoelectric conversion elements TL, TR, BL, BR.

Similarly, the fourth sub-pixel SPX4 may include a thirteenth photoelectric conversion element TL, a fourteenth photoelectric conversion element TR, a fifteenth photoelectric conversion element BL, and a sixteenth photoelectric conversion element BR that share a fourth floating diffusion area FD4. Further, the fourth sub-pixel SPX4 may include a thirteenth transmission gate TG41, a fourteenth transmission gate TG42, a fifteenth transmission gate TG43, and a sixteenth transmission gate TG44 that provide the fourth floating diffusion area FD4 with the signals provided from the thirteenth to sixteenth photoelectric conversion elements TL, TR, BL, BR.

Meanwhile, each of the plurality of sub-pixels SPX1, SPX2, SPX3, SPX4 may include a micro lens ML disposed to overlap a plurality of photoelectric conversion elements TL, TR, BL, BR. In the present exemplary embodiment, the single micro lens ML is illustrated as having a size that includes the four photoelectric conversion elements TL, TR, BL, BR, but it is understood that one or more other exemplary embodiments are not limited thereto. For example, the micro lens ML of a size including the four photoelectric conversion elements TL, TR, BL, BR may be formed in some areas among a plurality of pixels PX1, PX2, PX3, PX4, and the micro size ML of a size including only one of the photoelectric conversion elements TL, TR, BL, BR may be formed in some other areas.

As described above, the first pixel PX1 according to the present exemplary embodiment includes a total of sixteen photoelectric conversion elements, shares one floating diffusion node for every four photoelectric conversion elements, and includes a total of four micro lenses ML formed one-by-one for each of four photoelectric conversion elements. The first pixel PX1 also includes one color filter for sensing light of the green color band, as illustrated in FIG. 2.

The contents described above with reference to the first pixel PX1 of FIG. 3 may also be applied to the second pixel PX2, the third pixel PX3, and the fourth pixel PX4, except for a change in type of the color filter. For example, the color filter included in the second pixel PX2 may be for sensing light of the red color band, the color filter included in the third pixel PX3 may be for sensing light of the blue color band, and the color filter included in the fourth pixel PX4 may be for sensing light of the green color band.

There may be several methods for reading out the pixel array 10 having a structure as illustrated in FIGS. 2 and 3. Simply, a method of reading out all the photoelectric conversion elements illustrated in FIG. 2 or FIG. 3 may be considered. In addition, in a structure in which a plurality of photoelectric conversion elements shares a floating diffusion node, the readout method may be variably modified. The readout mode for determining such a readout method may be preset in the image sensor 1. A readout area may be defined on the pixel array 10 in accordance with the preset readout mode.

When the readout area is defined, the row driver 30 may read out the signals provided from the photoelectric conversion elements included in the readout area among the plurality of photoelectric conversion elements TL, TR, BL, BR. Specifically, the row driver 30 may generate a drive signal for reading out the signals provided from the photoelectric conversion element included in the readout area among the plurality of photoelectric conversion elements TL, TR, BL, BR, and may provide the drive signal to the pixel array 10.

Hereinafter, a specific exemplary embodiment in which the image sensor 1 operates according to various readout modes in the pixel structure of FIG. 3 will be described with reference to FIGS. 4 to 10.

FIGS. 4 to 10 are diagrams illustrating the readout of the pixel array 10 including the pixels of FIGS. 2 and/or 3, according to an exemplary embodiment. In particular, FIGS. 4 to 10 illustrate a structure in which one floating diffusion node is shared for each of four photoelectric conversion elements as described in FIG. 3, and illustrate a first readout mode to a fourth readout mode under such a structure.

Figure 4:
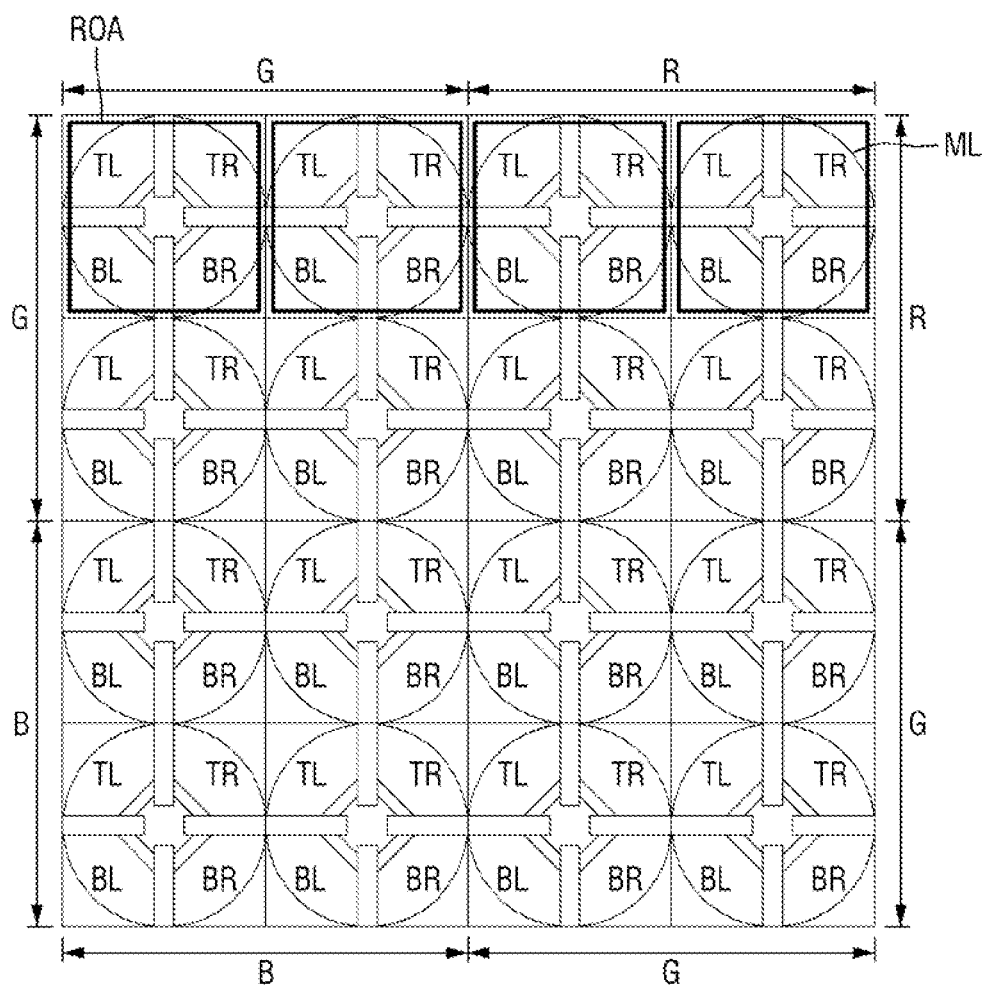
FIGS. 4 to 10 are diagrams illustrating a readout of the pixel array including the pixels of FIG. 3, according to an exemplary embodiment.

Referring to FIG. 4, when the preset readout mode is a first readout mode (or 4 PD sum mode), the image sensor 1 may read out all the photoelectric conversion elements illustrated in FIG. 4. That is, when the preset readout mode is the first readout mode, the readout area ROA is defined to include the first photoelectric conversion element TL to the eighth photoelectric conversion element BR in each of the first pixel PX1 and the second pixel PX2.

In this case, the row driver 30 performs the control to turn on the first transmission gate TG11 to the eighth transmission gate TG24 in each of the first pixel PX1 and the second pixel PX2, and may implement a charge sum.

Under the premise that the pixel array 10 is read in the unit of a row, if the readout of the readout area ROA illustrated by a thick line in the first row of FIG. 4 is completed, the readout area ROA is set in the next row, and the readout thereof may subsequently be performed.

Figure 5:
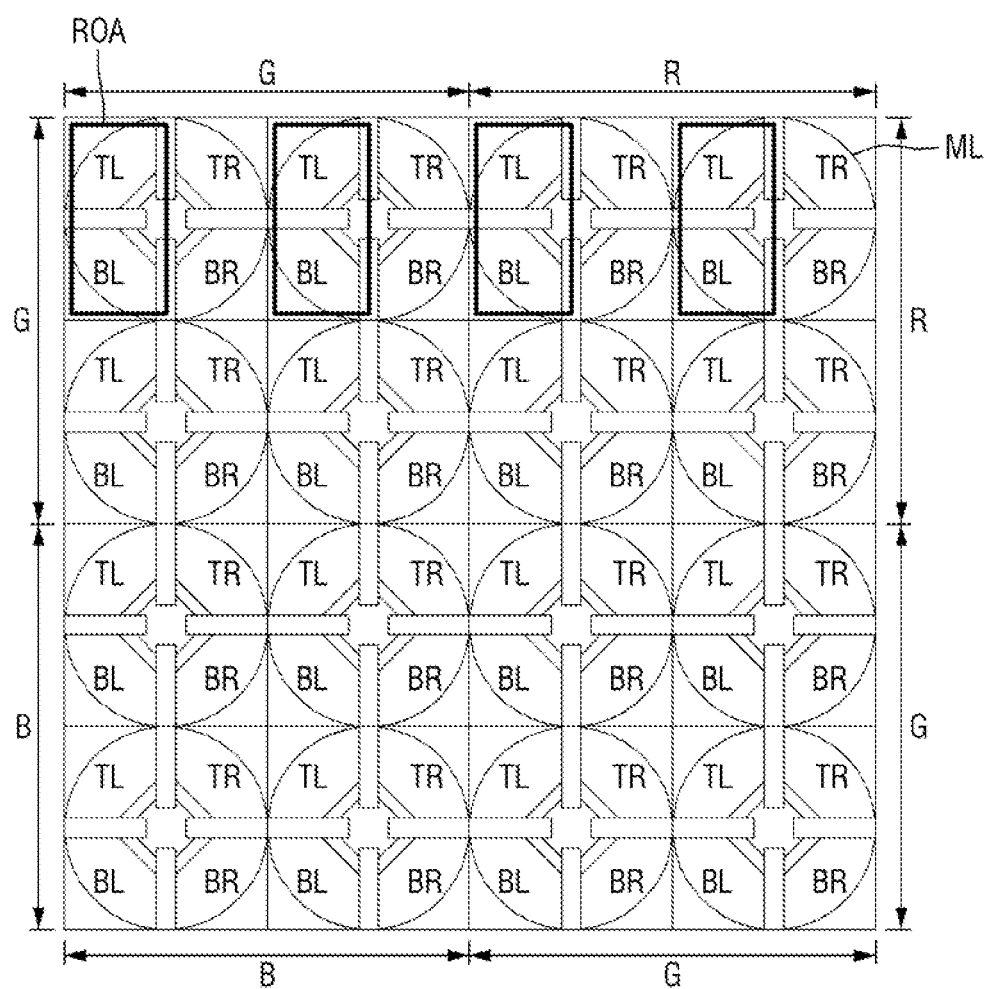
Figure 6:
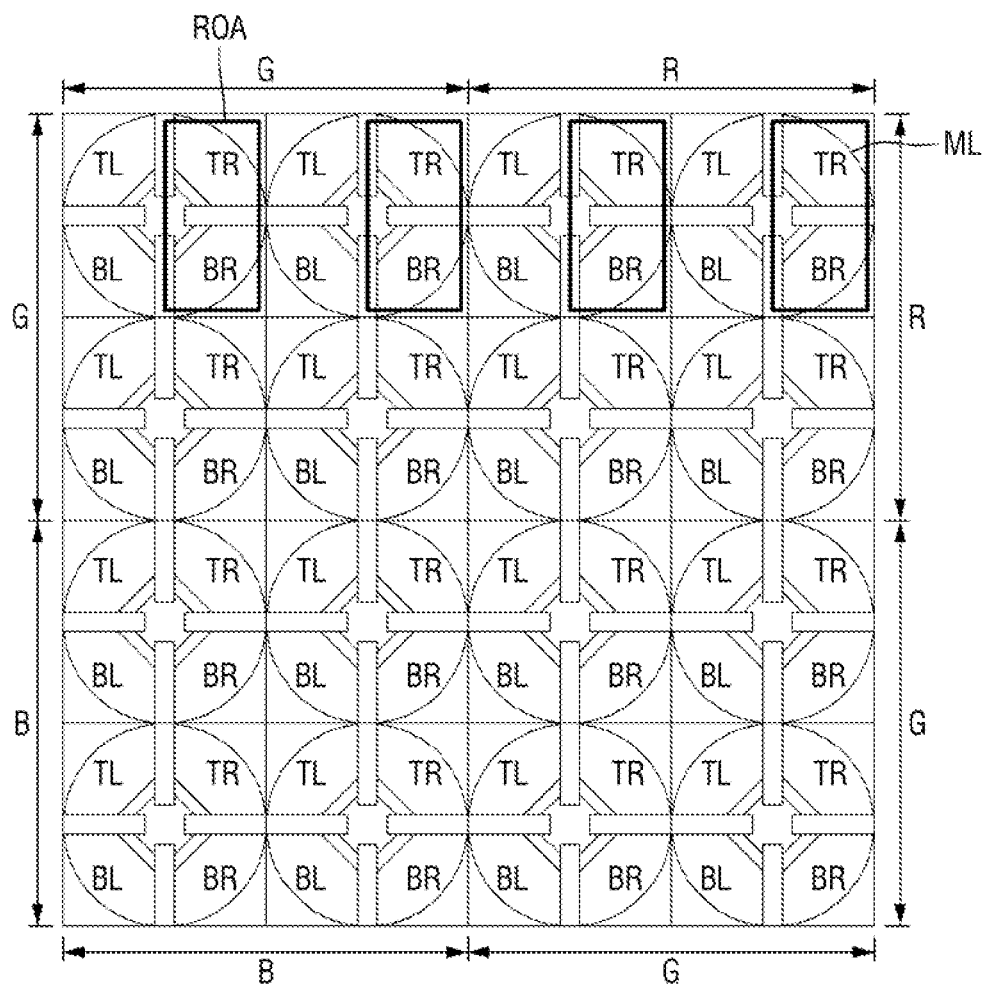

Next, referring to FIGS. 5 and 6, a case where the preset readout mode is a second readout mode (or 2 PD left/right sum mode) is illustrated. First, referring to FIG. 5, the readout area ROA is defined to include the first photoelectric conversion element TL, the third photoelectric conversion element BL, the fifth photoelectric conversion element TL, and the seventh photoelectric conversion element BL in each of the first pixel PX1 and the second pixel PX2.

In this case, the row driver 30 may perform the control to turn on the first transmission gate TG11, the third transmission gate TG13, the fifth transmission gate TG21 and the seventh transmission gate TG23, and to turn off the second transmission gate TG12, the fourth transmission gate TG14, the sixth transmission gate TG22 and the eighth transmission gate TG24 in each of the first pixel PX1 and the second pixel PX2, thereby implementing a charge sum.

On the other hand, referring to FIG. 6, the readout area ROA may be defined to include the second photoelectric conversion element TR, the fourth photoelectric conversion element BR, the sixth photoelectric conversion element TR and the eighth photoelectric conversion element BR in each of the first pixel PX1 and the second pixel PX2.

In this case, the row driver 30 may perform the control to turn on the second transmission gate TG12, the fourth transmission gate TG14, the sixth transmission gate TG22 and the eighth transmission gate TG24, and to turn off the first transmission gate TG11, the third transmission gate TG13, the fifth transmission gate TG21 and the seventh transmission gate TG23 in each of the first pixel PX1 and the second pixel PX2, thereby implementing a charge sum.

Under the premise that the pixel array 10 is read in the unit of a row, when the readout of the readout area ROA illustrated by the thick line in the first row of FIGS. 5 and 6 is completed, a readout area ROA is set in the next row and the readout thereof will subsequently be performed.

Figure 7:
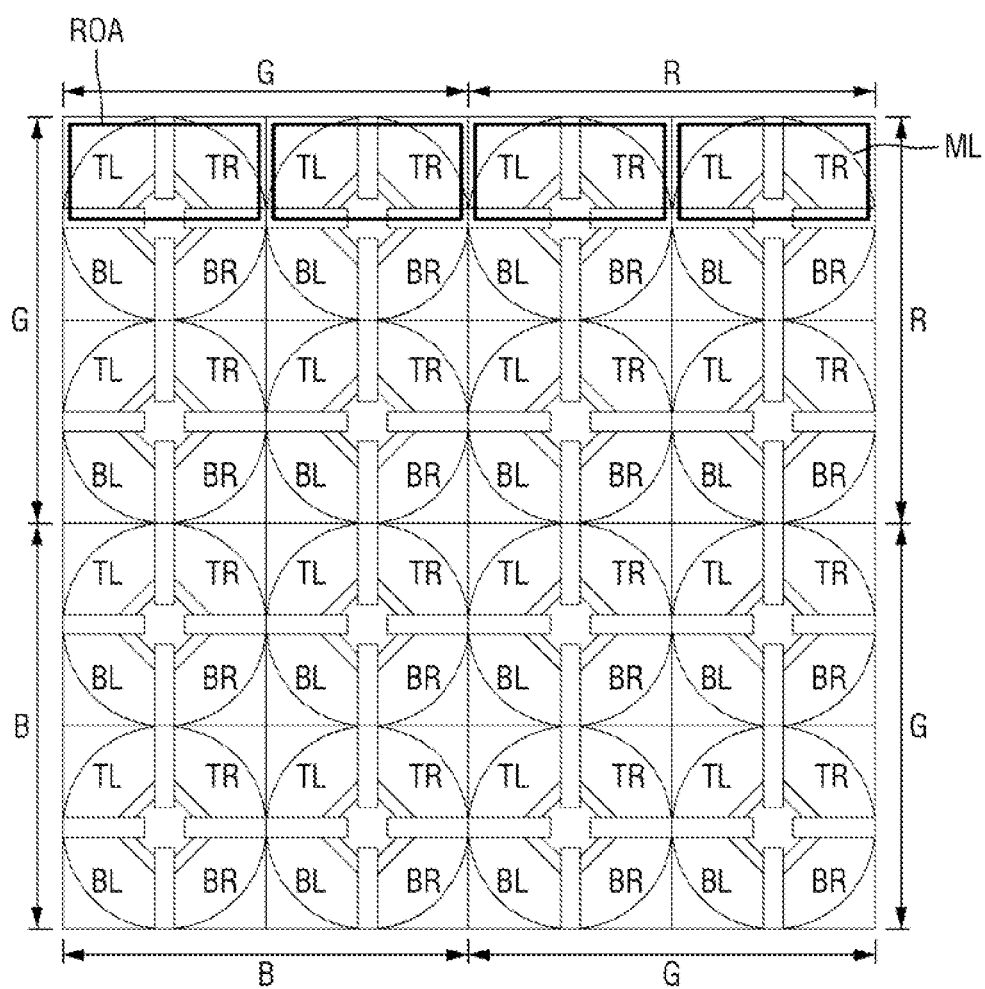
Figure 8:
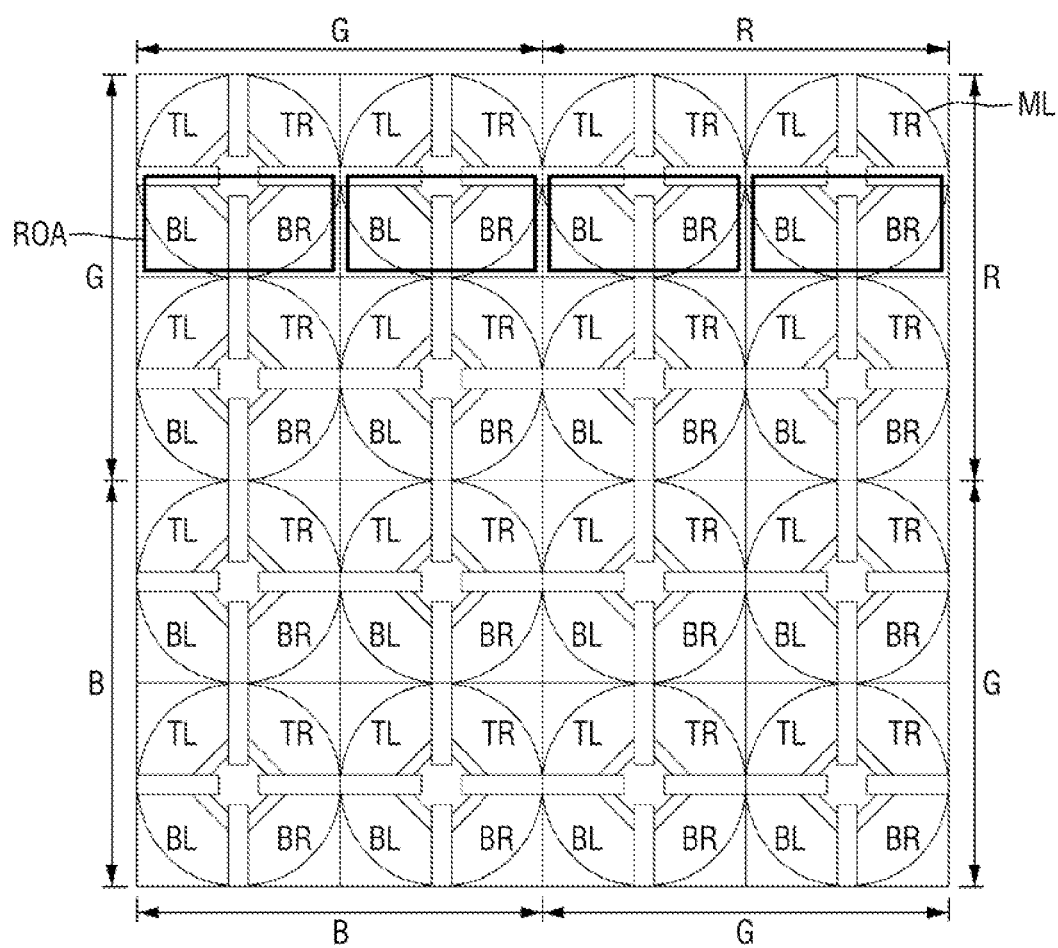

Next, referring to FIGS. 7 and 8, a case where the preset readout mode is a third readout mode (or 2 PD top/bottom sum mode) is illustrated. First, referring to FIG. 7, the readout area ROA is defined to include the first photoelectric conversion element TL, the second photoelectric conversion element TR, the fifth photoelectric conversion element TL and the sixth photoelectric conversion element TR in each of the first pixel PX1 and the second pixel PX2.

In this case, the row driver 30 may perform the control to turn on the first transmission gate TG11, the second transmission gate TG12, the fifth transmission gate TG21 and the sixth transmission gate TG22, and to turn off the third transmission gate TG13, the fourth transmission gate TG14, the seventh transmission gate TG23 and the eighth transmission gate TG24 in each of the first pixel PX1 and the second pixel PX2, thereby implementing a charge sum.

On the other hand, referring to FIG. 8, the readout area ROA may also be defined to include the third photoelectric conversion element BL, the fourth photoelectric conversion element BR, the seventh photoelectric conversion element BL and the eighth photoelectric conversion element BR in each of the first pixel PX1 and the second pixel PX2.

In this case, the row driver 30 may perform the control to turn on the third transmission gate TG13, the fourth transmission gate TG14, the seventh transmission gate TG23 and the eighth transmission gate TG24, and to turn off the first transmission gate TG11, the second transmission gate TG12, the fifth transmission gate TG21 and the sixth transmission gate TG22 in each of the first pixel PX1 and the second pixel PX2, thereby implementing a charge sum.

Under the premise that the pixel array 10 is read in the unit of a row, when the readout of the readout area ROA illustrated by thick lines in the first row of FIGS. 7 and 8 is completed, the readout area ROA is set in the next row and the readout thereof will subsequently be performed.

Figure 9:
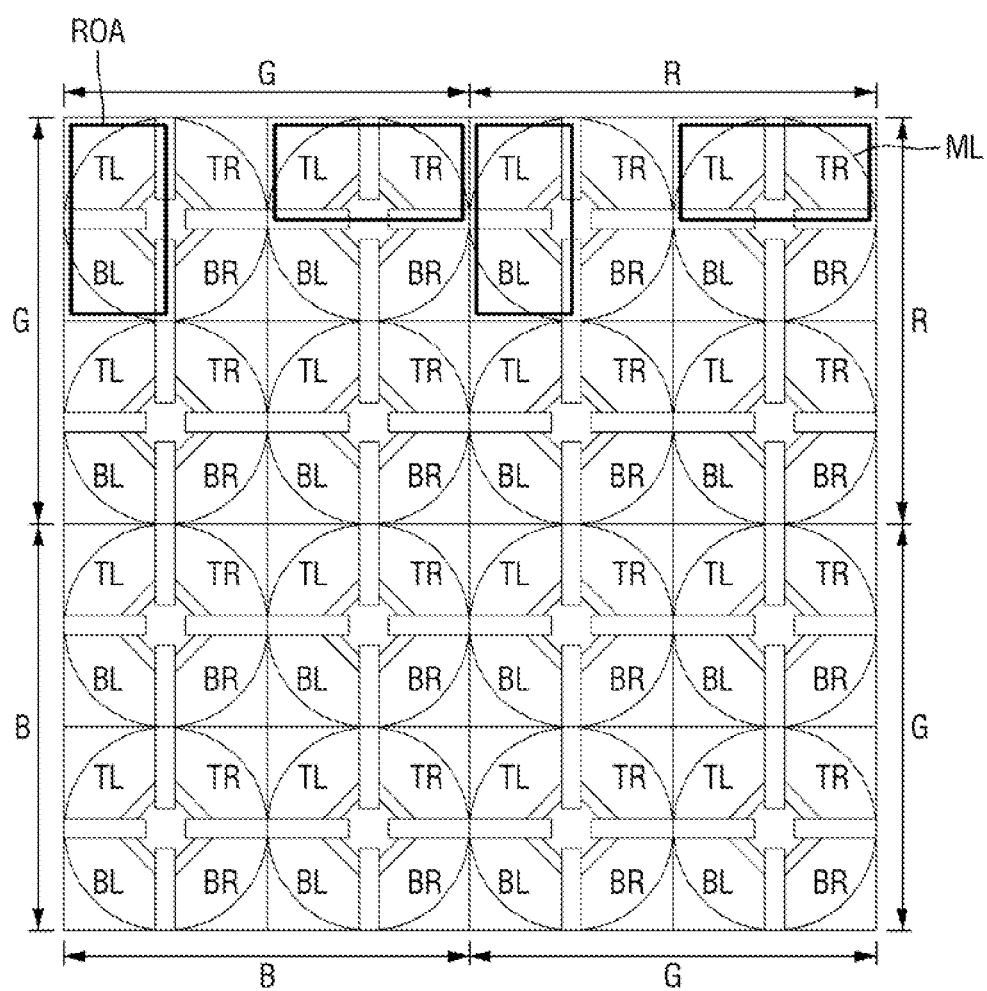
Figure 10:
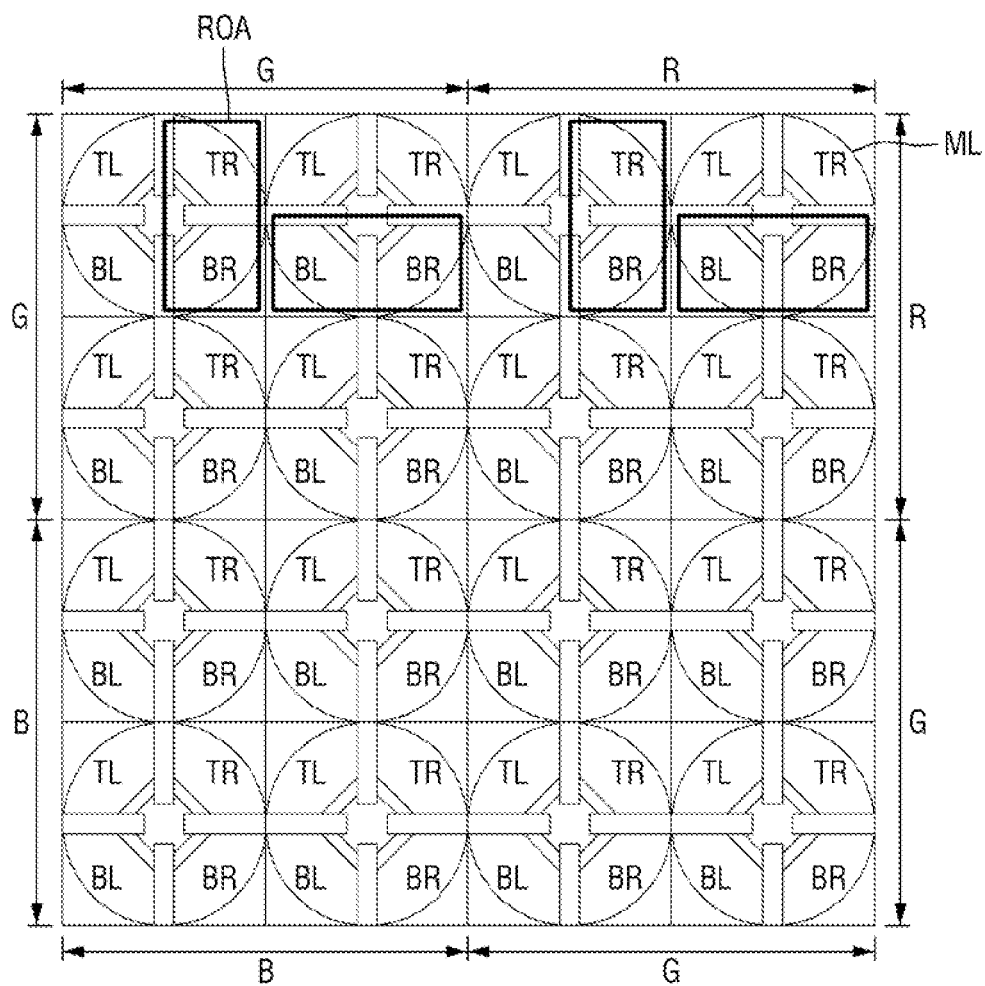

Next, referring to FIGS. 9 and 10, a case is where the preset readout mode is a fourth readout mode (or left/right and top/bottom combination mode) is illustrated. First, referring to FIG. 9, the readout area ROA is defined to include the first photoelectric conversion element TL, the third photoelectric conversion element BL, the fifth photoelectric conversion element TL and the sixth photoelectric conversion element TR in each of the first pixel PX1 and the second pixel PX2.

In this case, the row driver 30 may perform the control to turn on the first transmission gate TG11, the third transmission gate TG13, the fifth transmission gate TG21 and the sixth transmission gate TG22, and to turn off the second transmission gate TG12, the fourth transmission gate TG14, the seventh transmission gate TG23 and the eighth transmission gate TG24 in each of the first pixel PX1 and the second pixel PX2, thereby implementing a charge sum.

On the other hand, referring to FIG. 10, the readout area ROA may also be defined to include the second photoelectric conversion element TR, the fourth photoelectric conversion element BR, the seventh photoelectric conversion element BL and the eighth photoelectric conversion element BR in each of the first pixel PX1 and the second pixel PX2.

In this case, the row driver 30 may perform the control to turn on the second transmission gate TG12, the fourth transmission gate TG14, the seventh transmission gate TG23 and the eighth transmission gate TG24, and to turn off the first transmission gate TG11, the third transmission gate TG13, the fifth transmission gate TG21 and the sixth transmission gate TG22 in each of the first pixel PX1 and the second pixel PX2, thereby implementing a charge sum.

Under the premise that the pixel array 10 is read in the unit of a row, when the readout of the readout area ROA illustrated by thick lines in the first row of FIGS. 9 and 10 is completed, the readout area ROA is set in the next row and the readout thereof will subsequently be performed.

Figure 11:
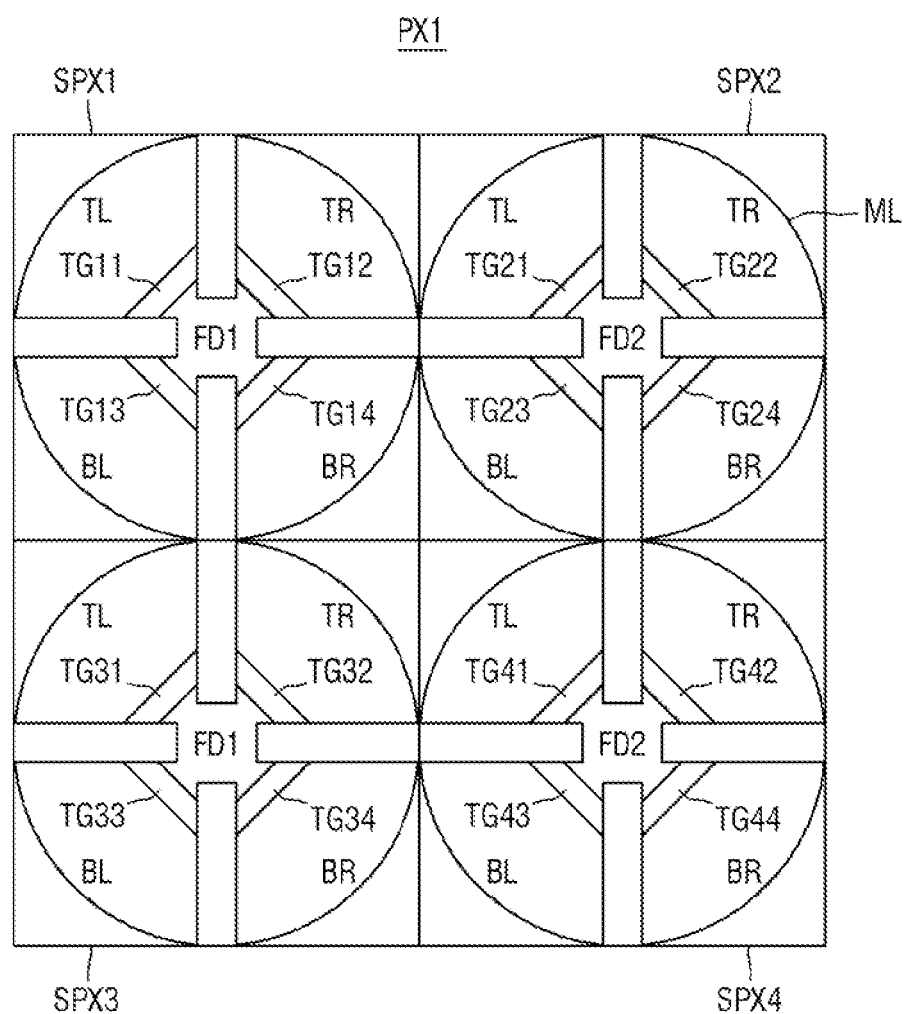
FIG. 11 is a diagram illustrating pixels defined on the pixel array of FIG. 2 according to an exemplary embodiment.

FIG. 11 is a diagram illustrating pixels defined on the pixel array of FIG. 2 according to an exemplary embodiment.

A main difference between the exemplary embodiment of FIG. 3 and the present exemplary embodiment is that the first pixel PX1 of FIG. 11 includes a first sub-pixel SPX1 and a third sub-pixel SPX3 sharing the first floating diffusion area FD1, and a second sub-pixel SPX2 and a fourth sub-pixel SPX4 sharing the second floating diffusion area FD2.

That is, the first sub-pixel SPX1 and the third sub-pixel SPX3 include a first photoelectric conversion element TL, a second photoelectric conversion element TR, a third photoelectric conversion element BL, a fourth photoelectric conversion element BR, a ninth photoelectric conversion element TL, a tenth photoelectric conversion element TR, an eleventh photoelectric conversion element BL, and a twelfth photoelectric conversion element BR that share the first floating diffusion area FD1. The second sub-pixel SPX2 and the fourth sub-pixel SPX4 include a fifth photoelectric conversion element TL, a sixth photoelectric conversion element TR, a seventh photoelectric conversion element BL, an eighth photoelectric conversion element BR, a thirteenth photoelectric conversion element TL, a fourteenth photoelectric conversion element TR, a fifteenth photoelectric conversion element BL, and a sixteenth photoelectric conversion element BR that share the second floating diffusion area FD2.

In summary, in the present exemplary embodiment, the first pixel PX1 includes a total of sixteen photoelectric conversion elements, shares one floating diffusion node for every eight photoelectric conversion elements, and includes a total of four micro lenses ML formed one-by-one for every four photoelectric conversion elements. The first pixel PX1 includes one color filter for sensing light of the green color band, as illustrated in FIG. 2.

The contents described with reference to the first pixel PX1 of FIG. 11 may be applied to the second pixel PX2, the third pixel PX3, and the fourth pixel PX4 as it is, except for a change in types of color filters. For example, the second pixel may include a red color filter, the third pixel may include a blue color filter, and the fourth pixel may include a green color filter, although it is understood that exemplary embodiments are not limited thereto.

Hereinafter, a specific exemplary embodiment in which the image sensor 1 operates in accordance with various readout modes in the pixel structure of FIG. 11 will be described with reference to FIGS. 12 to 22.

FIGS. 12 to 22 illustrate a readout of a pixel array including the pixels implemented as described with reference to the exemplary embodiment of FIG. 11. In particular, FIGS. 12 to 22 illustrate a structure in which one floating diffusion node is shared for each of eight photoelectric conversion elements as described in FIG. 11, and illustrate fifth to fifth readout modes under such a structure.

In particular, it is possible to implement the readout modes described above with reference to FIGS. 4 to 10 as an example even in the structure in which one floating diffusion node is shared for each of eight photoelectric conversion elements. Thus, it is understood that the contents thereof also fall within the scope of the present inventive concept. However, the contents overlap the contents described above except that there is a difference in the number of photoelectric conversion elements sharing the floating diffusion node, and therefore redundant descriptions will not be repeated below.

Figure 12:
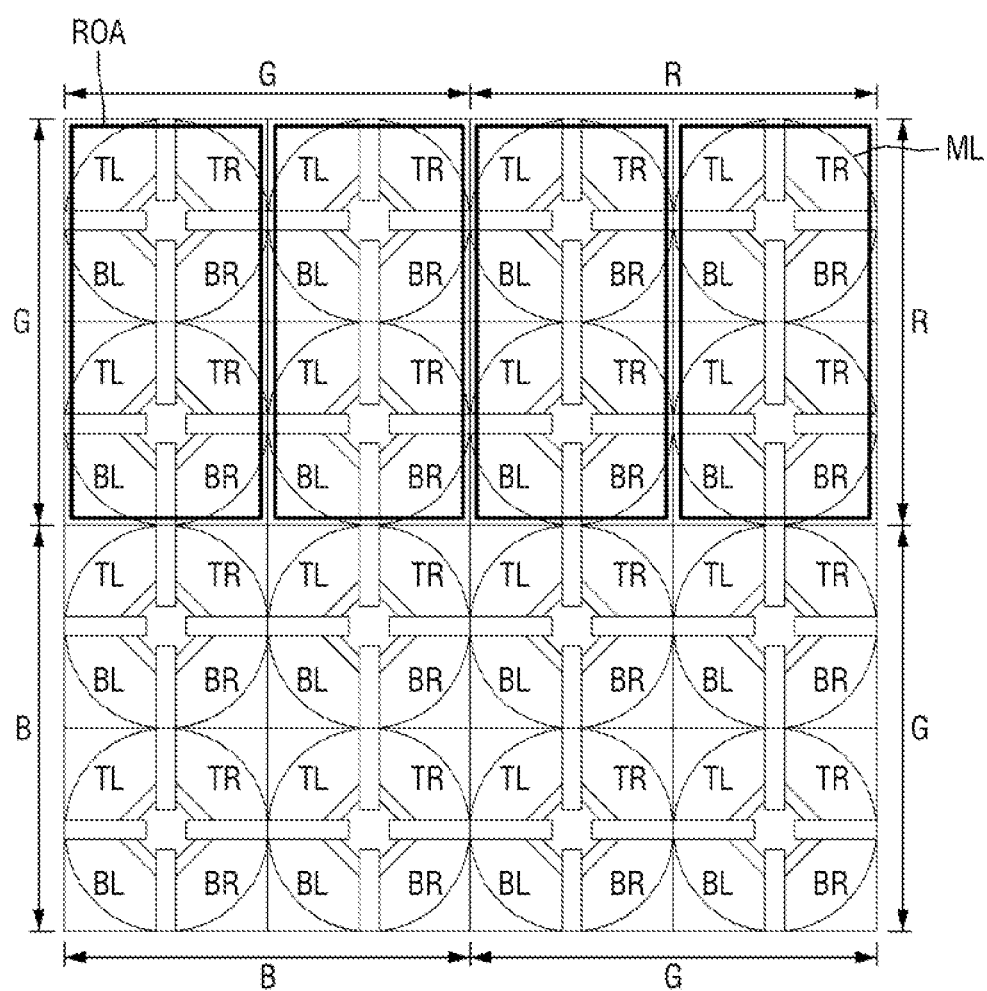
FIGS. 12 to 22 illustrate the readout of the pixel array including the pixels of FIG. 11.

Referring to FIG. 12, when the preset readout mode is the first readout mode (or 8 PD sum mode), the image sensor 1 may read out all the photoelectric conversion elements illustrated in FIG. 12. That is, when the preset readout mode is the first readout mode, the readout area ROA is defined to include the first photoelectric conversion element TL to the sixteenth photoelectric conversion element BR in each of the first pixel PX1 and the second pixel PX2.

In this case, the row driver 30 may control to turn on the first transmission gate TG11 to the sixteenth transmission gate TG44 in each of the first pixel PX1 and the second pixel PX2, thereby implementing a charge sum.

Under the premise that the pixel array 10 is read in the unit of a row, when the readout of the readout area ROA illustrated by the thick line in the first row of FIG. 12 is completed, the readout area ROA is set in the next row and the readout thereof may subsequently be performed.

Figure 13:
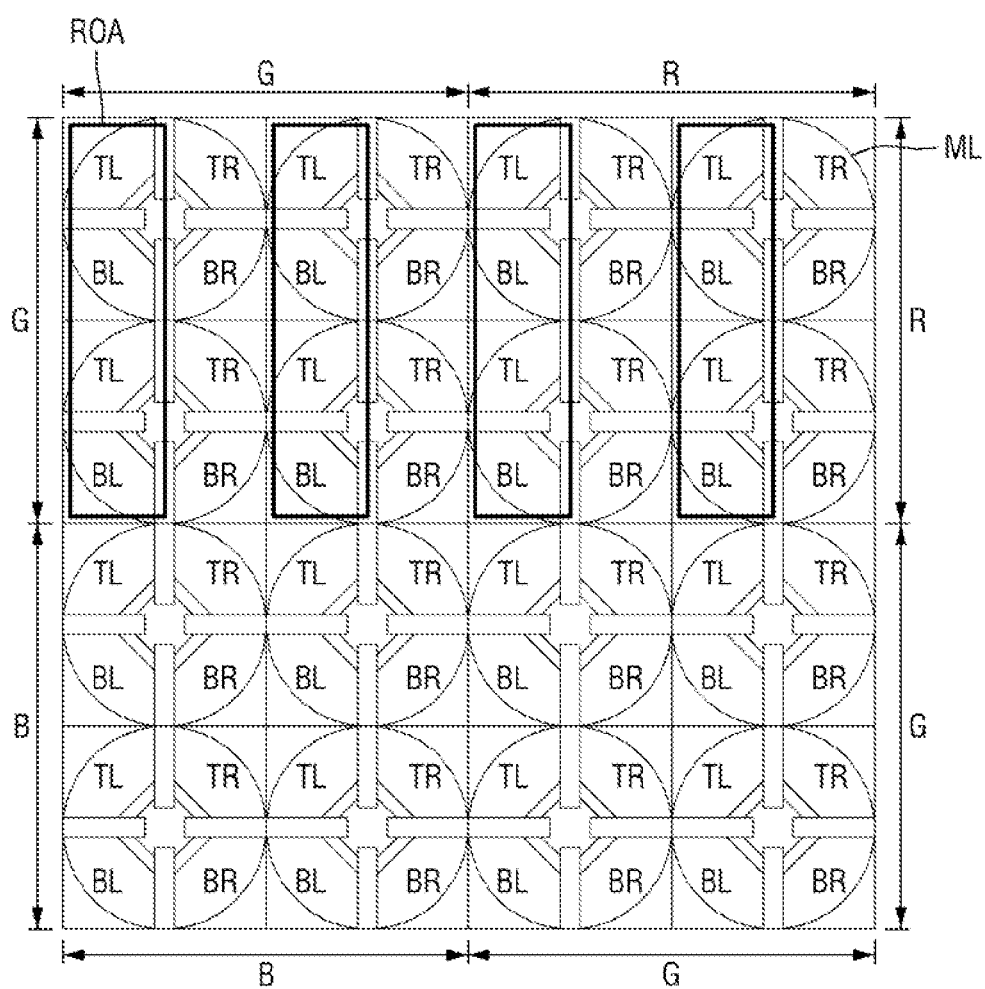
Figure 14:
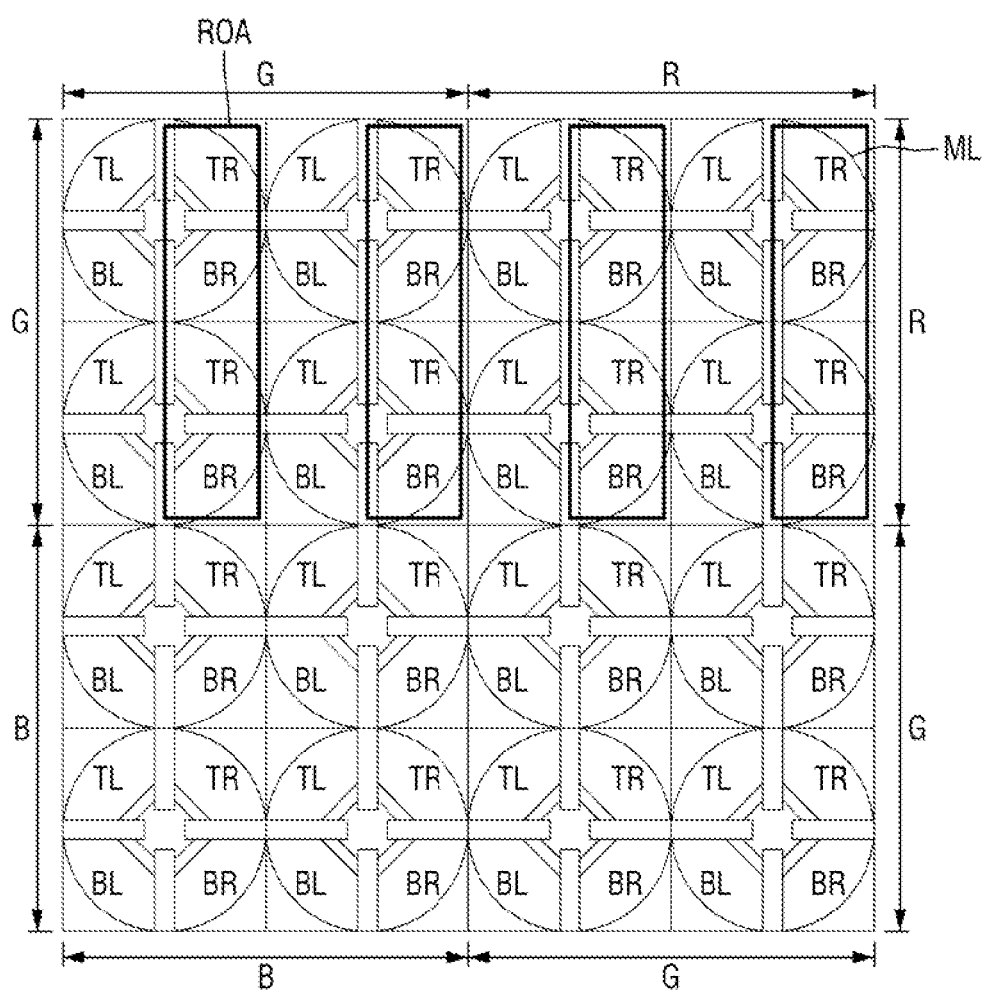

Next, referring to FIGS. 13 and 14, a case where the preset readout mode is the second readout mode (or 4 PD left/right sum mode) is illustrated. First, referring to FIG. 13, the readout area ROA is defined to include the first photoelectric conversion element TL, the third photoelectric conversion element BL, the ninth photoelectric conversion element TL, the eleventh photoelectric conversion element BL, the fifth photoelectric conversion element TL, the seventh photoelectric conversion element BL, the thirteenth photoelectric conversion element TL, and the fifteenth photoelectric conversion element BL in each of the first pixel PX1 and the second pixel PX2.

On the other hand, referring to FIG. 14, the readout area ROA may also be defined to include the second photoelectric conversion element TR, the fourth photoelectric conversion element BR, the tenth photoelectric conversion element TR, the twelfth photoelectric conversion element BR, the sixth photoelectric conversion element TR, the eighth photoelectric conversion element BR, the fourteenth photoelectric conversion element TR and the sixteenth photoelectric conversion element BR in each of the first pixel PX1 and the second pixel PX2.

In the cases of FIGS. 13 and 14, the row driver 30 may perform the control to turn on the transmission gates belonging to the readout area ROA and to turn off the transmission gates not belonging to the readout area ROA in the first pixel PX1 and the second pixel PX2, thereby implementing a charge sum. Further, under the premise that the pixel array 10 is read in the unit of a row, when the readout of the readout area ROA illustrated by the thick line in the first row of FIGS. 13 and 14 is completed, the readout area ROA is set in the next row and the readout thereof will subsequently be performed.

Figure 15:
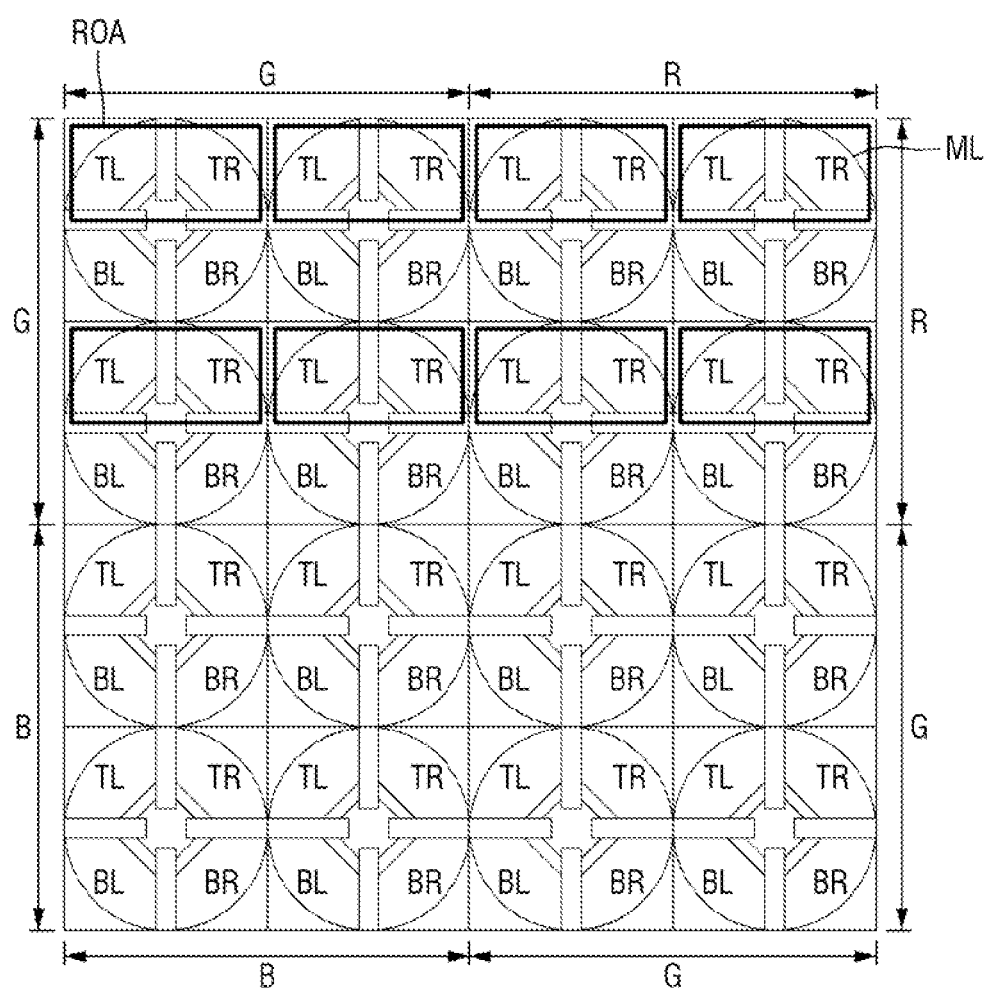
Figure 16:
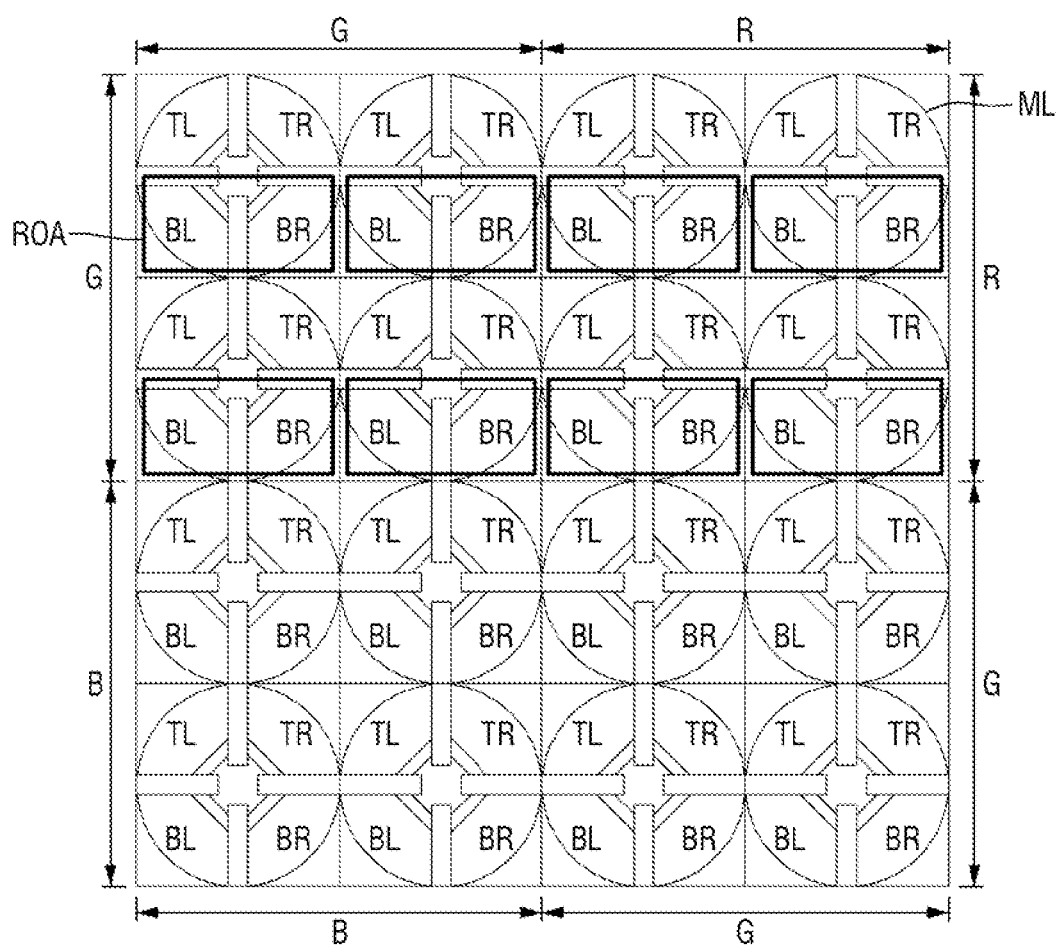

Next, referring to FIGS. 15 and 16, a case where the preset readout mode is the third readout mode (or 4 PD top/bottom sum mode) is illustrated. First, referring to FIG. 15, the readout area ROA is defined to include the first photoelectric conversion element TL, the second photoelectric conversion element TR, the ninth photoelectric conversion element TL, the tenth photoelectric conversion element TR, the fifth photoelectric conversion element TL, the sixth photoelectric conversion element TR, the thirteenth photoelectric conversion element TL and the fourteenth photoelectric conversion element TR in each of the first pixel PX1 and the second pixel PX2.

On the other hand, referring to FIG. 16, the readout area ROA may also be defined to include the third photoelectric conversion element BL, the fourth photoelectric conversion element BR, the eleventh photoelectric conversion element BR, the twelfth photoelectric conversion element BR, the seventh photoelectric conversion element BL, the eighth photoelectric conversion element BR, the fifteenth photoelectric conversion element BL and the sixteenth photoelectric conversion element BR in each of the first pixel PX1 and the second pixel PX2.

In the cases of FIGS. 15 and 16, the row driver 30 may perform the control to turn on the transmission gates belonging to the readout area ROA and to turn off the transmission gates not belonging to the readout area ROA in the first pixel PX1 and the second pixel PX2, thereby implementing a charge sum. Further, under the premise that the pixel array 10 is read in the unit of a row, when the readout of the readout area ROA illustrated by thick lines in the first row of FIGS. 15 and 16 is completed, the readout area ROA is set in the next row, and the readout thereof will subsequently be performed.

Figure 17:
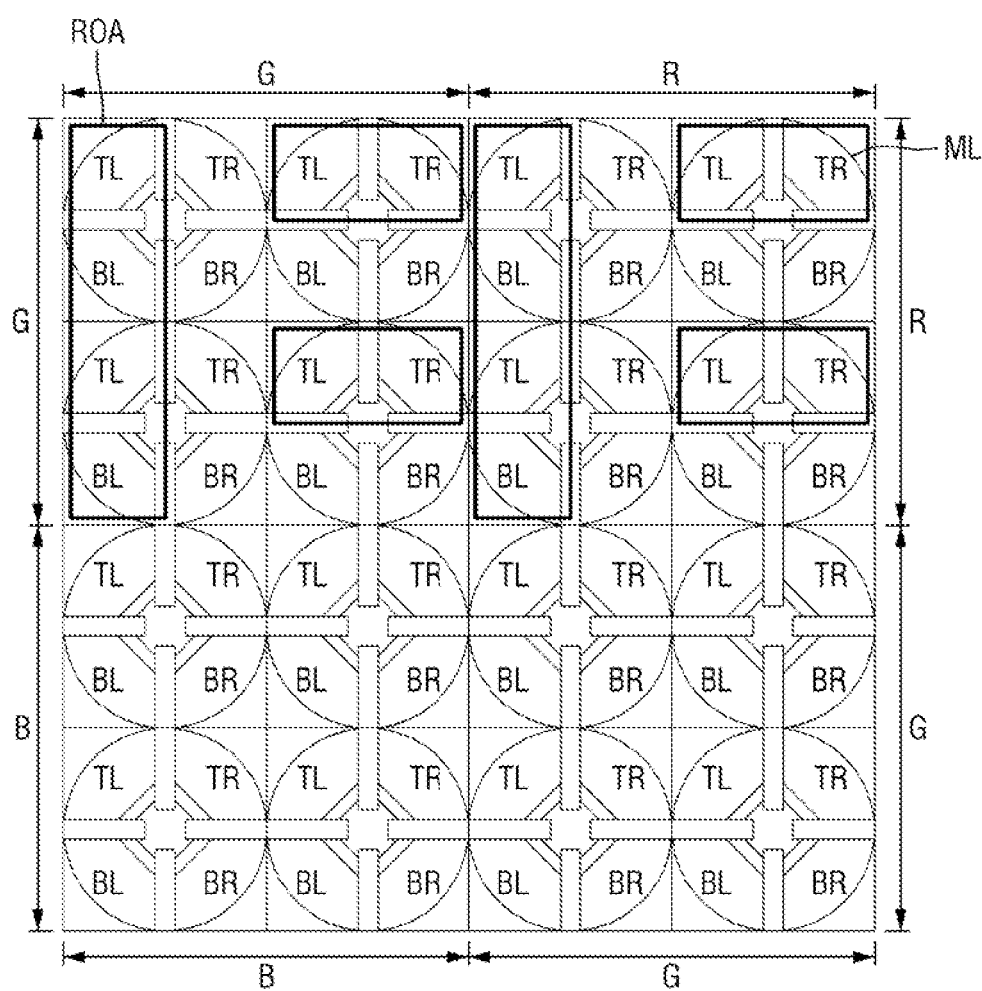
Figure 18:
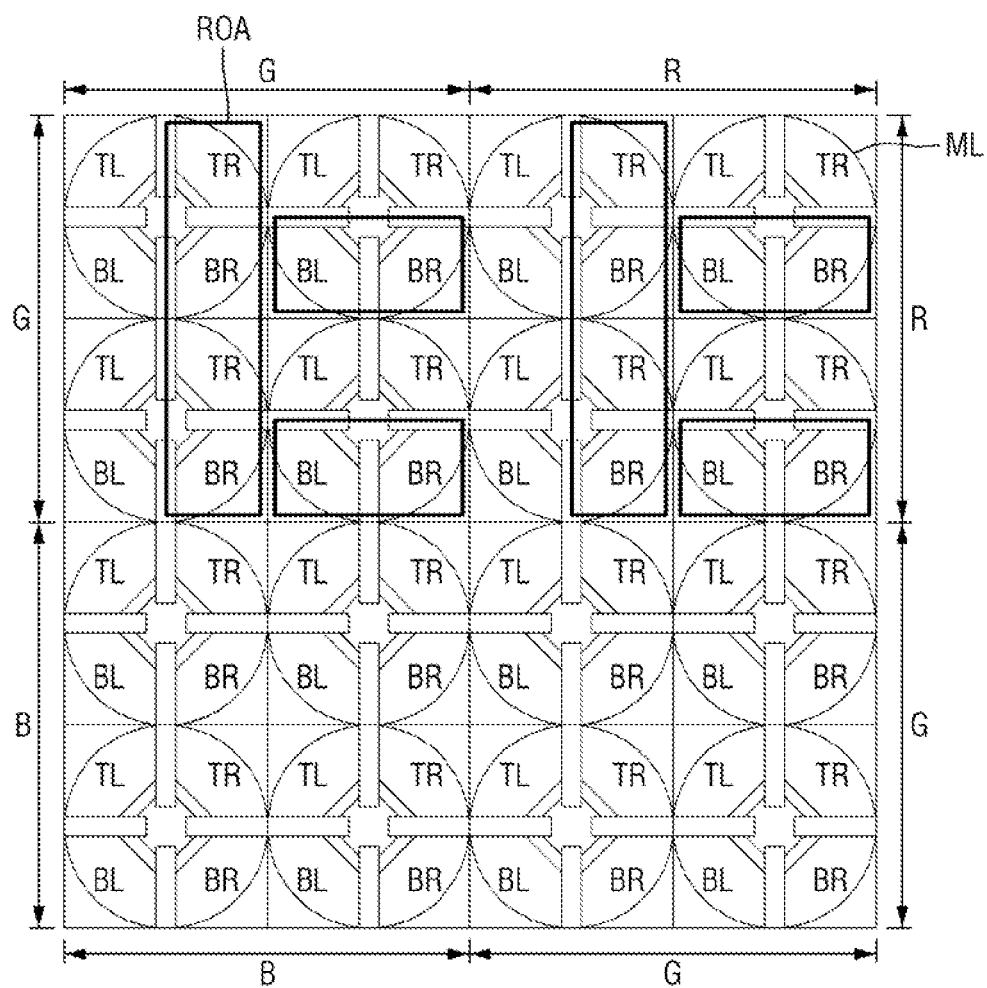
Figure 19:
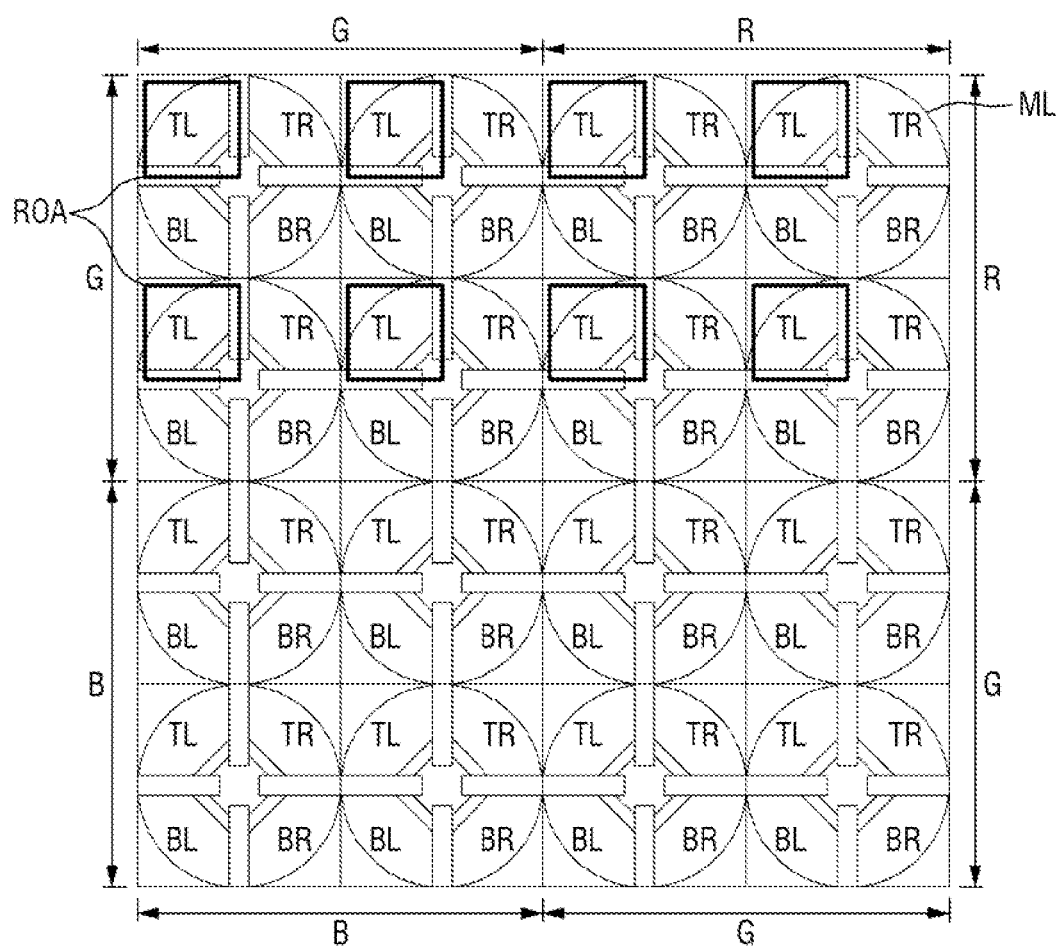

Next, referring to FIGS. 17 and 18, a case where the preset readout mode is the fourth readout mode (or left/right and top/bottom combination mode) is illustrated. First, referring to FIG. 17, the readout area ROA is defined to include the first photoelectric conversion element TL, the third photoelectric conversion element BL, the ninth photoelectric conversion element TL, the eleventh photoelectric conversion element BL, the fifth photoelectric conversion element TL, the sixth photoelectric conversion element TR, the thirteenth photoelectric conversion element TL and the fourteenth photoelectric conversion element TR in each of the first pixel PX1 and the second pixel PX2.

On the other hand, referring to FIG. 18, the readout area ROA may also be defined to include the second photoelectric conversion element TR, the fourth photoelectric conversion element BR, the tenth photoelectric conversion element TR, the twelfth photoelectric conversion element BR, the seventh photoelectric conversion element BL, the eighth photoelectric conversion element BR, the fifteenth photoelectric conversion element BL and the sixteenth photoelectric conversion element BR in each of the first pixel PX1 and the second pixel PX2.

In the case of FIGS. 17 and 18, the row driver 30 may perform the control to turn on the transmission gates belonging to the readout area ROA and to turn off the transmission gates not belonging to the readout area ROA in the first pixel PX1 and the second pixel PX2, thereby implementing a charge sum. Further, under the premise that the pixel array 10 is read in the unit of a row, when the readout of the readout area ROA illustrated by thick lines in the first row of FIGS. 17 and 18 is completed, the readout area ROA is set in the next row and the readout thereof will subsequently be performed.

Next, referring to FIGS. 19 to 22, a case where the preset readout mode is the fifth readout mode (or additional charge sum mode) is illustrated. First, referring to FIG. 19, the readout area ROA is defined to include the first photoelectric conversion element TL, the ninth photoelectric conversion element TL, the fifth photoelectric conversion element TL and the thirteenth photoelectric conversion element TL in each of the first pixel PX1 and the second pixel PX2.

Figure 20:
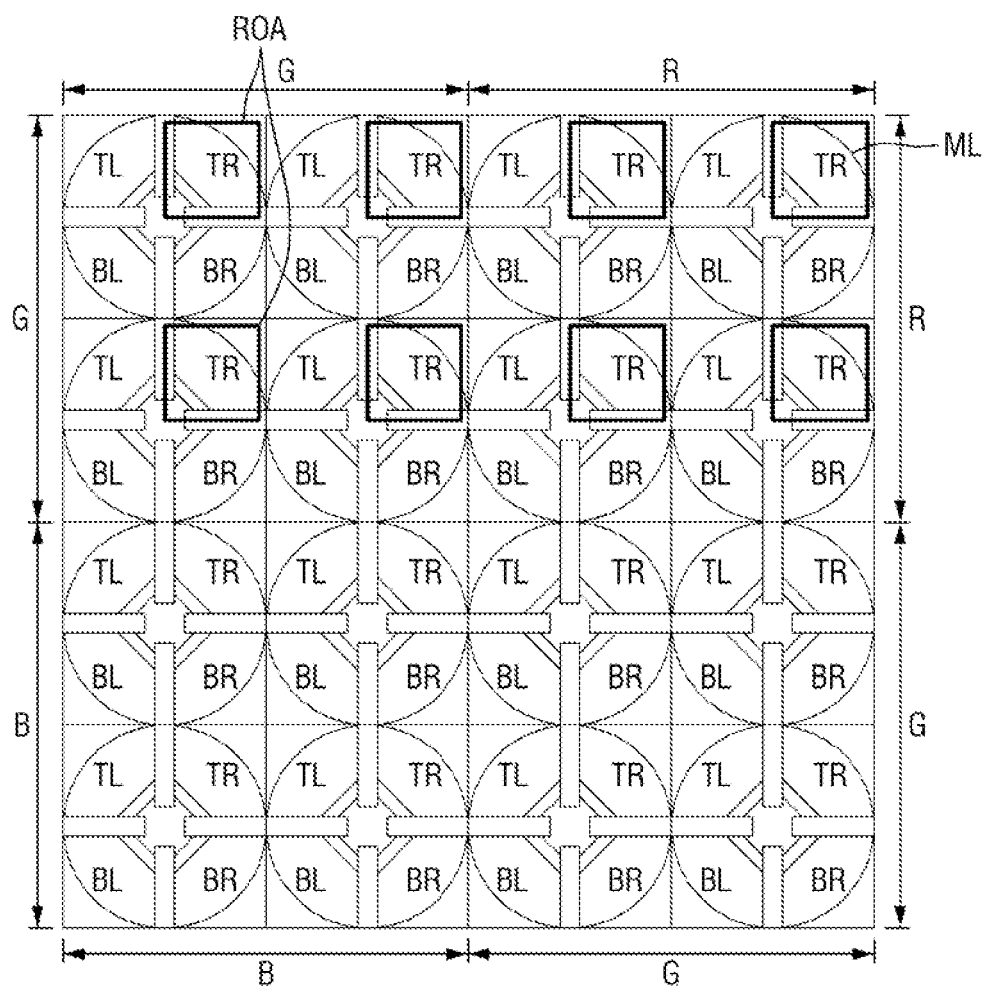

On the other hand, referring to FIG. 20, the readout area ROA may also be defined to include includes the second photoelectric conversion element TR, the tenth photoelectric conversion element TR, the sixth photoelectric conversion element TR and the fourteenth photoelectric conversion element TR in each of the first pixel PX1 and the second pixel PX2.

Figure 21:
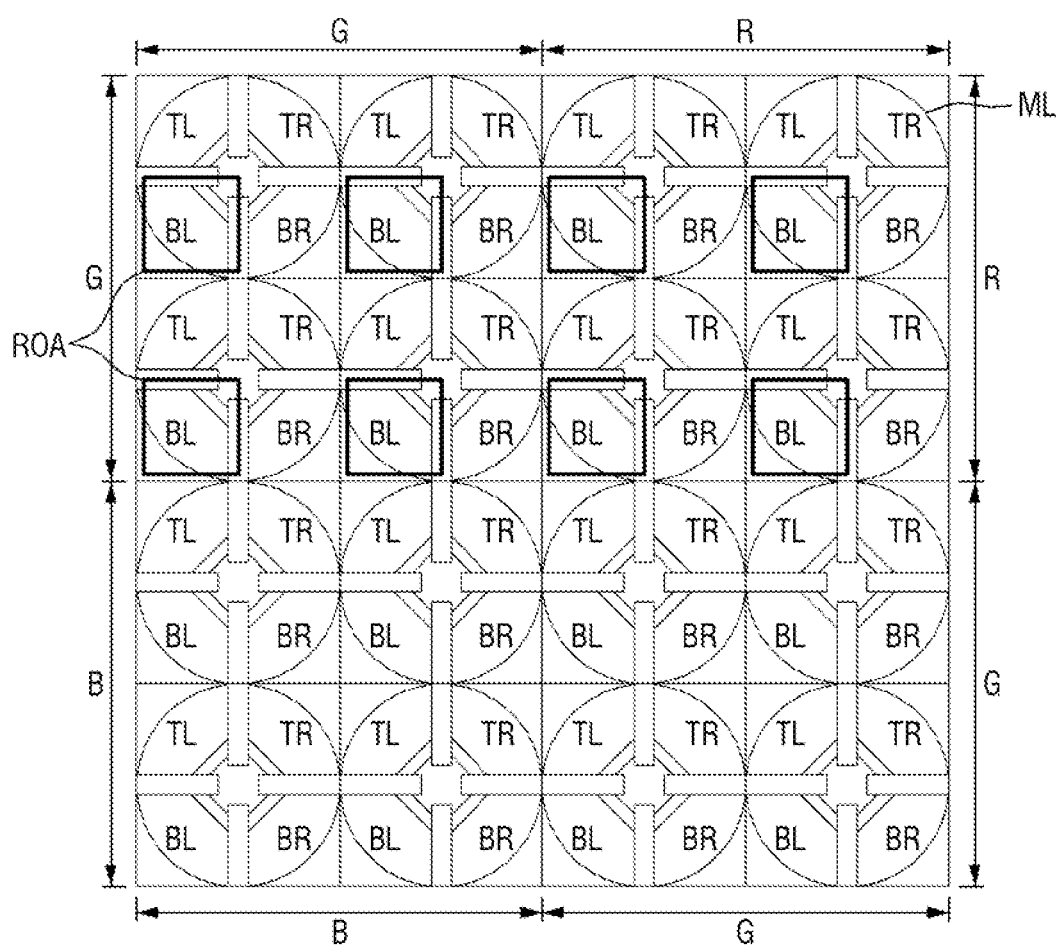

Further, referring to FIG. 21, the readout area ROA may also be defined to include the third photoelectric conversion element BL, the eleventh photoelectric conversion element BL, the seventh photoelectric conversion element BL and the fifteenth photoelectric conversion element BL in each of the first pixel PX1 and the second pixel PX2.

Figure 22:
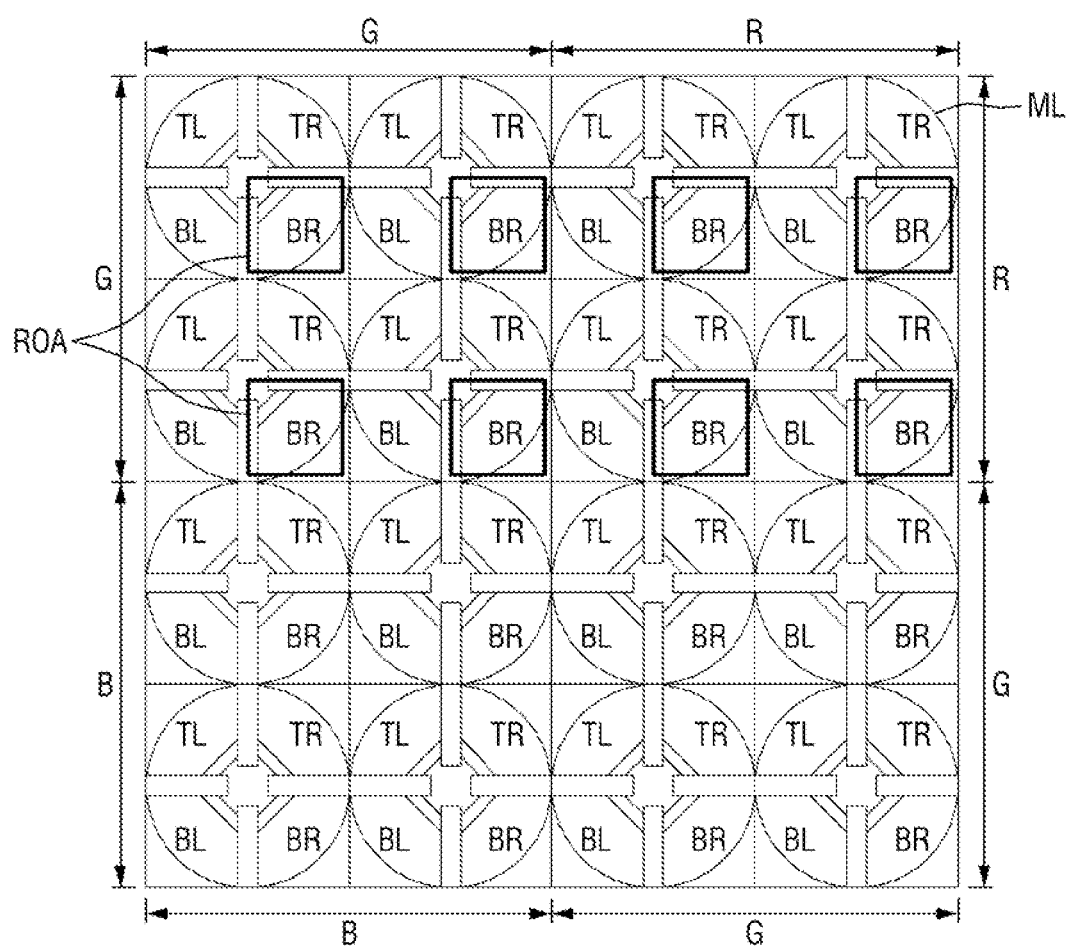

On the other hand, referring to FIG. 22, the readout area ROA may also be defined to include the fourth photoelectric conversion element BR, the twelfth photoelectric conversion element BR, the eight photoelectric conversion element BR and the sixteenth photoelectric conversion element BR in each of the first pixel PX1 and the second pixel PX2.

In the cases of FIGS. 19 to 22, the row driver 30 may perform the control to turn on the transmission gates belonging to the readout area ROA and to turn off the transmission gates not belonging to the readout area ROA in the first pixel PX1 and the second pixel PX2, thereby implementing a charge sum.

Figure 23:
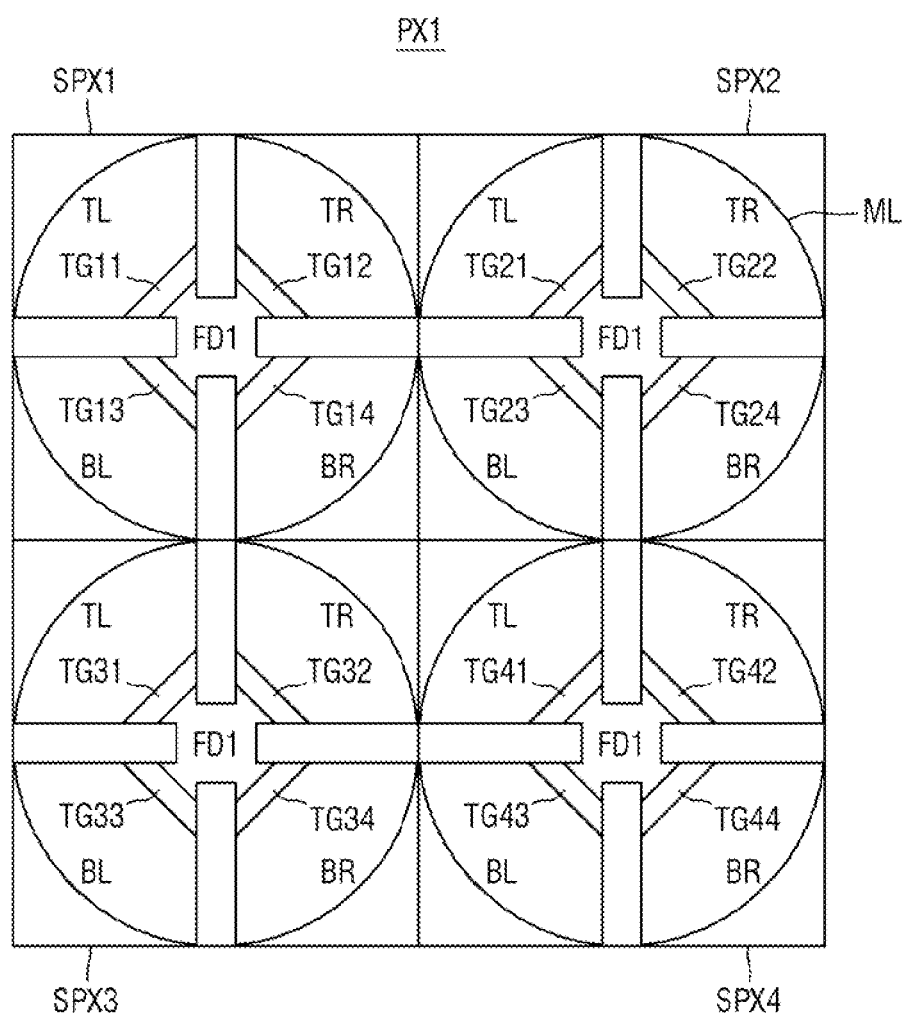
FIG. 23 is a diagram illustrating pixels defined on the pixel array of FIG. 2 according to an exemplary embodiment.

FIG. 23 is a diagram illustrating pixels defined on the pixel array of FIG. 2 according to an exemplary embodiment.

A main difference between the exemplary embodiment of FIG. 3 and the present exemplary embodiment is that the first pixel PX1 of FIG. 23 includes a first sub-pixel SPX1 to a fourth sub-pixel SPX4 that share the first floating diffusion area FD1.

That is, the first sub-pixel SPX1 to the fourth sub-pixel SPX4 include the first photoelectric conversion element TL, the second photoelectric conversion element TR, the third photoelectric conversion element BL, the fourth photoelectric conversion element BR, the fifth photoelectric conversion element TL, the sixth photoelectric conversion element TR, the seventh photoelectric conversion element BL, the eighth photoelectric conversion element BR, the ninth photoelectric conversion element TL, the tenth photoelectric conversion element TR, the eleventh photoelectric conversion element BL, the twelfth photoelectric conversion element BR, the thirteenth photoelectric conversion element TL, the fourteenth photoelectric conversion element TR, the fifteenth photoelectric conversion element BL and the sixteenth photoelectric conversion element BR that share the first floating diffusion area FD1.

In summary, in the present exemplary embodiment, the first pixel PX1 includes a total of sixteen photoelectric conversion elements, shares one floating diffusion node by the sixteen photoelectric conversion elements, and includes a total of four micro lenses ML formed one-by-one for each of four photoelectric conversion elements. The first pixel PX1 includes one color filter for sensing light of the green color band, as illustrated in FIG. 2.

The contents described referring to the first pixel PX1 of FIG. 23 may be applied to the second pixel PX2, the third pixel PX3, and the fourth pixel PX4 as it is, except a change in types of color filter. For example, the second pixel may include a red color filter, the third pixel may include a blue color filter, and the fourth pixel may include a green color filter, although it is understood that exemplary embodiments are not limited thereto.

Hereinafter, a specific exemplary embodiment in which the image sensor 1 operates in the pixel structure of FIG. 23 in accordance with various readout modes will be described with reference to FIGS. 24 to 34.

FIGS. 24 to 34 are diagrams illustrating a readout of the pixel array including the pixels implemented as described with reference to the exemplary embodiment of FIG. 23. In particular, FIGS. 24 to 34 illustrate a structure in which the sixteen photoelectric conversion elements share one floating diffusion node as described in FIG. 23, and illustrate a first readout mode to a fifth readout mode under such a structure.

In particular, even in the structure in which the sixteen photoelectric conversion elements share one floating diffusion node, it is possible to implement the readout mode described above with reference to FIGS. 4 to 10 and the readout mode described above with reference to FIGS. 12 to 22. Thus, it is understood that the contents also fall within the scope of the present inventive concept. However, the contents overlap the above contents except that there is a difference in the number of photoelectric conversion elements sharing the floating diffusion node, and therefore redundant descriptions will not be repeated below.

Figure 24:
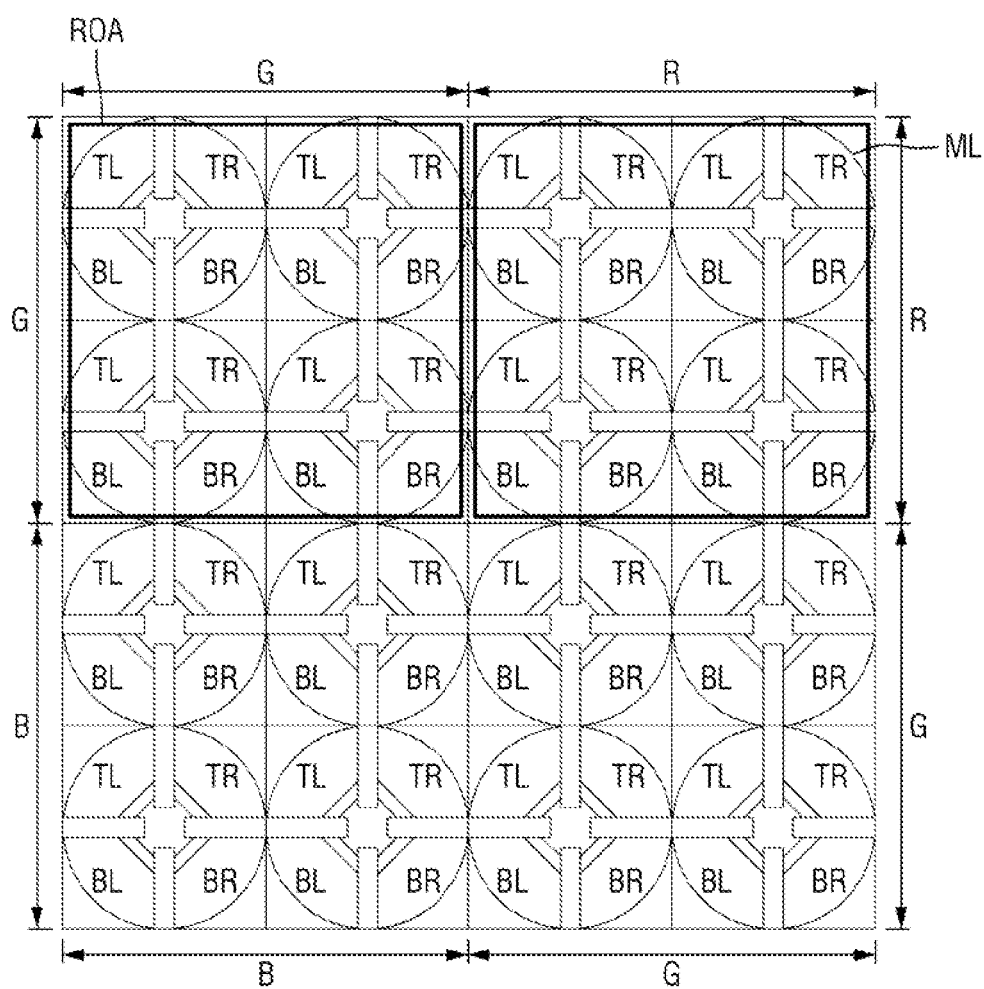
FIGS. 24 to 34 are diagrams illustrating the readout of the pixel array including the pixels of FIG. 23.

Referring to FIG. 24, when the preset readout mode is the first readout mode (or 16 PD sum mode), the image sensor 1 may read out all the photoelectric conversion elements illustrated in FIG. 24. That is, when the preset readout mode is the first readout mode, the readout area ROA is defined to include the first photoelectric conversion element TL to the sixteenth photoelectric conversion element BR in each of the first pixel PX1 and the second pixel PX2.

In this case, the row driver 30 may perform the control to turn on the first transmission gate TG11 to the sixteenth transmission gate TG44 in each of the first pixel PX1 and the second pixel PX2, thereby implementing a charge sum.

Under the premise that the pixel array 10 is read in the unit of a row, when the readout of the readout area ROA illustrated by the thick line in the first row of FIG. 24 is completed, the readout area ROA is set in the next row and the readout thereof may subsequently be performed.

Figure 25:
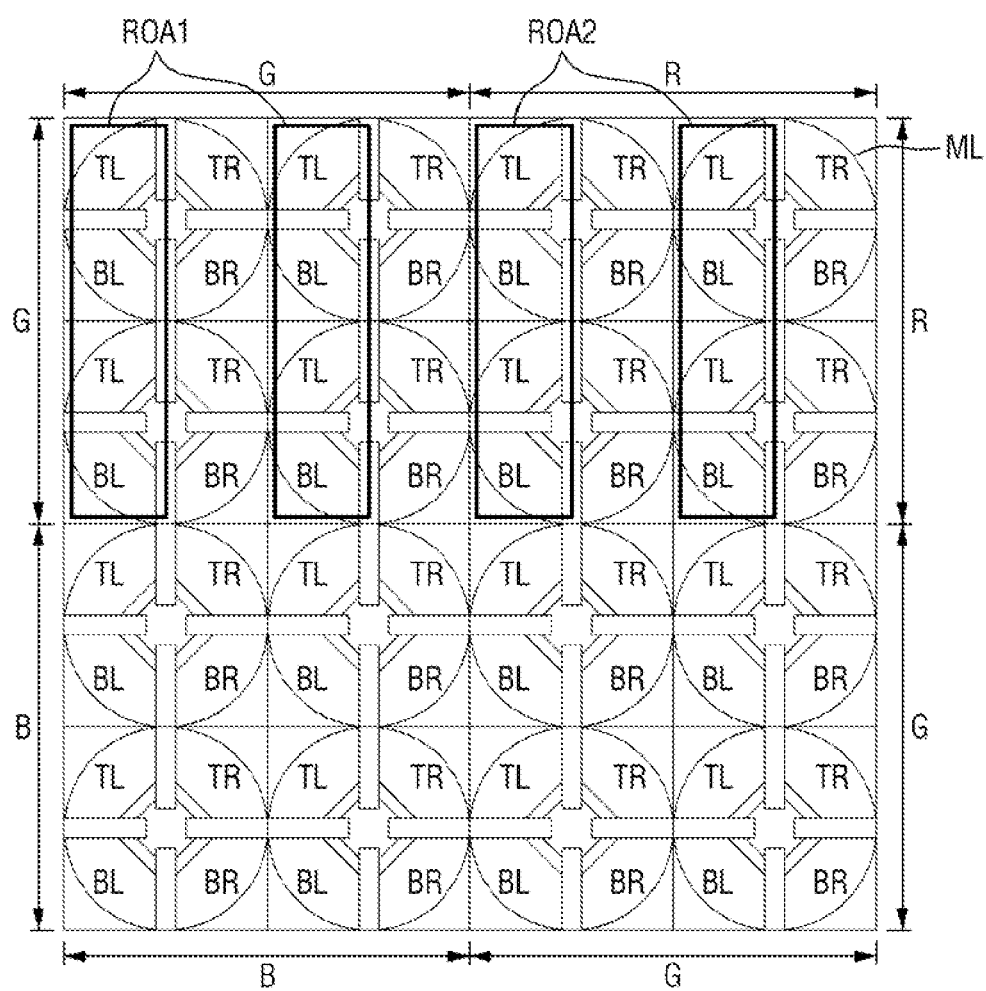
Figure 26:
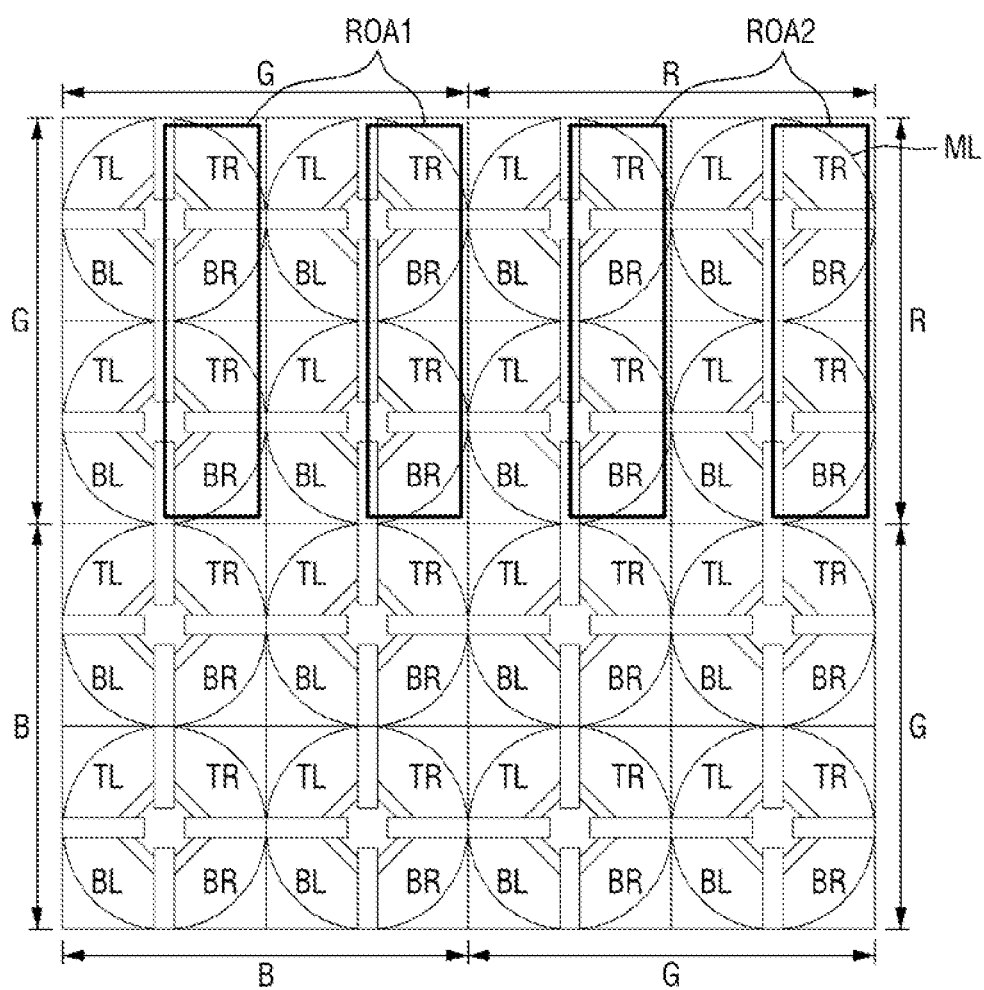

Next, referring to FIGS. 25 and 26, a case where the preset readout mode is a second readout mode (or 8 PD left/right sum mode) is illustrated. First, referring to FIG. 25, the first readout area ROA1 is defined to include the first photoelectric conversion element TL, the third photoelectric conversion element BL, the fifth photoelectric conversion element TL, the seventh photoelectric conversion element BL, the ninth photoelectric conversion element TL, the eleventh photoelectric conversion element BL, the thirteenth photoelectric conversion element TL, and the fifteenth photoelectric conversion element BL in the first pixel PX1. The second readout area ROA2 is defined to include the first photoelectric conversion element TL, the third photoelectric conversion element BL, the fifth photoelectric conversion element TL, the seventh photoelectric conversion element BL, the ninth photoelectric conversion element TL, the eleventh photoelectric conversion element BL, the thirteenth photoelectric conversion element TL, and the fifteenth photoelectric conversion element BL in the second pixel PX2.

On the other hand, referring to FIG. 26, the first readout area ROA1 may also be defined to include the second photoelectric conversion element TR, the fourth photoelectric conversion element BR, the sixth photoelectric conversion element TR, the eighth photoelectric conversion element BR, the tenth photoelectric conversion element TR, the twelfth photoelectric conversion element BR, the fourteenth photoelectric conversion element TR and the sixteenth photoelectric conversion element BR in the first pixel PX1. The second readout area ROA2 may also be defined to include the second photoelectric conversion element TR, the fourth photoelectric conversion element BR, the sixth photoelectric conversion element TR, the eighth photoelectric conversion element BR, the tenth photoelectric conversion element TR, the twelfth photoelectric conversion element BR, the fourteenth photoelectric conversion element TR and the sixteenth photoelectric conversion element BR in the second pixel PX2.

In the cases of FIGS. 25 and 26, the row driver 30 may perform the control to turn on the transmission gates belonging to the readout areas ROA1 and ROA2 and to turn off the transmission gates not belonging to the readout areas ROA1 and ROA2 in the first pixel PX1 and the second pixel PX2, thereby implementing a charge sum. Further, under the premise that the pixel array 10 is read in the unit of a row, when the readout of the readout areas ROA1 and ROA2 illustrated by the thick lines in the first row of FIGS. 25 and 26 is completed, the readout areas ROA1 and ROA2 are set in the next row and the readout thereof will subsequently be performed.

Figure 27:
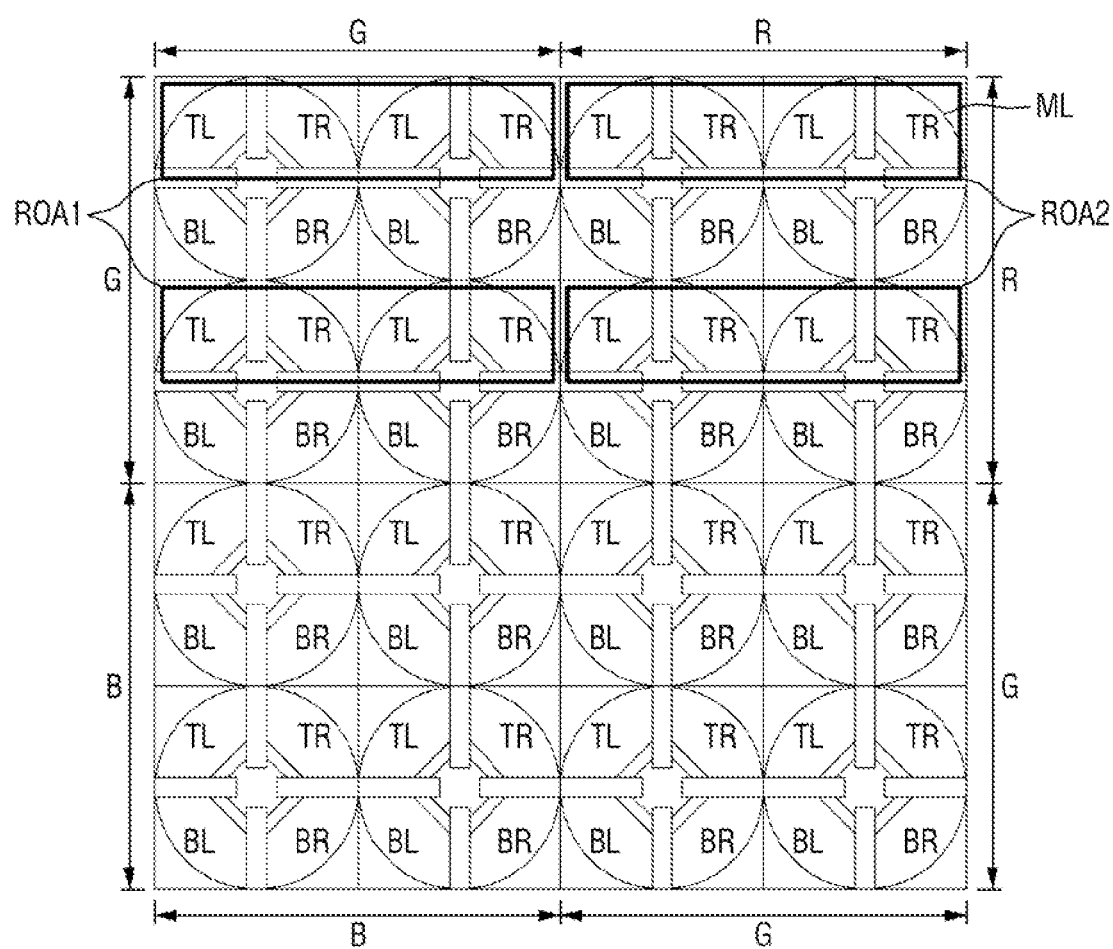
Figure 28:
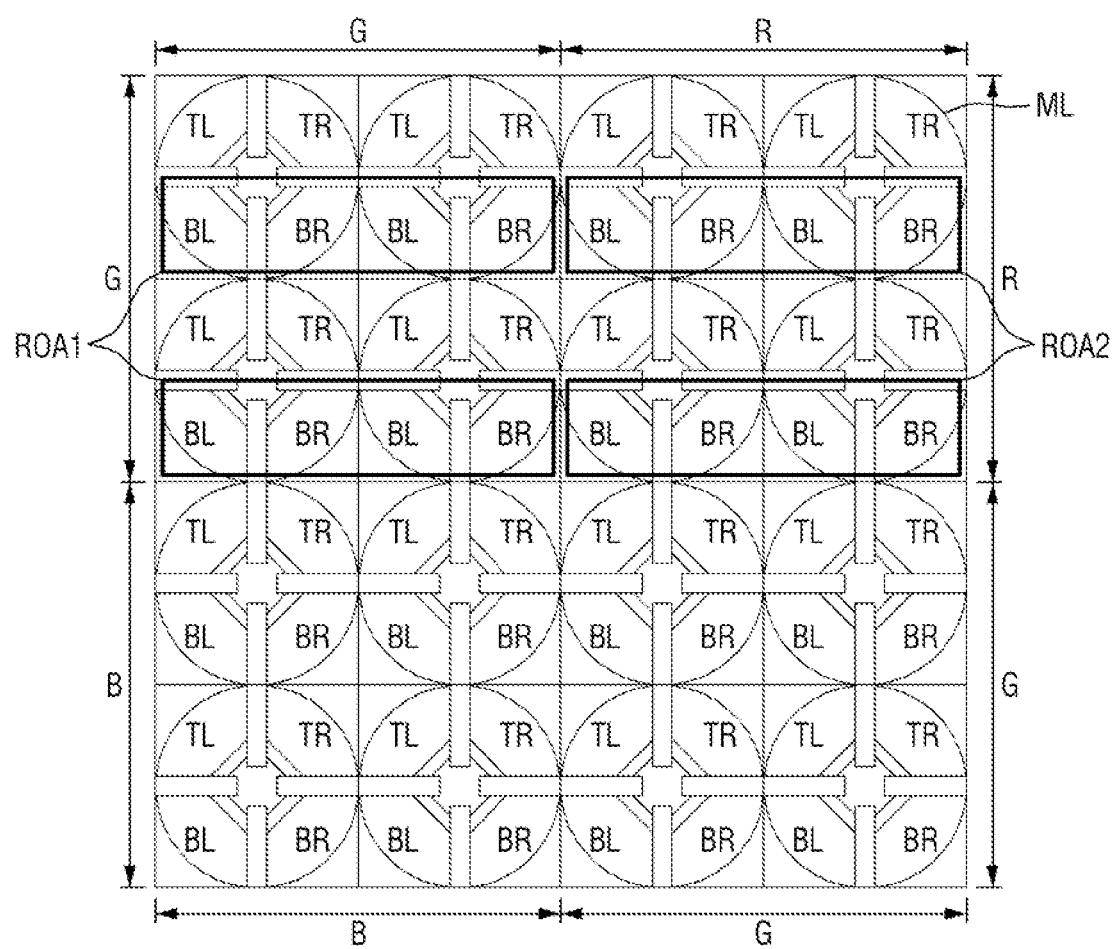

Next, referring to FIGS. 27 and 28, a case where the preset readout mode is a third readout mode (or 8 PD top/bottom sum mode) is illustrated. First, referring to FIG. 27, the first readout area is defined to include the first photoelectric conversion element TL, the second photoelectric conversion element TR, the fifth photoelectric conversion element TL, the sixth photoelectric conversion element TR, the ninth photoelectric conversion element TL, the tenth photoelectric conversion element TR, the thirteenth photoelectric conversion element TL, and the fourteenth photoelectric conversion element TR in the first pixel PX1. The second readout area ROA2 is defined to include the first photoelectric conversion element TL, the second photoelectric conversion element TR, the fifth photoelectric conversion element TL, the sixth photoelectric conversion element TR, the ninth photoelectric conversion element TL, the tenth photoelectric conversion element TR, the thirteenth photoelectric conversion element TL, and the fourteenth photoelectric conversion element TR in the second pixel PX2.

On the other hand, referring to FIG. 28, the first readout area ROA1 may also be defined to include the third photoelectric conversion element BL, the fourth photoelectric conversion element BR, the seventh photoelectric conversion element BL, the eighth photoelectric conversion element BR, the eleventh photoelectric conversion element BL, the twelfth photoelectric conversion element BR, the fifteenth photoelectric conversion element BL and the sixteenth photoelectric conversion element BR in the first pixel PX1. The second readout area ROA2 may also be defined to include the third photoelectric conversion element BL, the fourth photoelectric conversion element BR, the seventh photoelectric conversion element BL, the eighth photoelectric conversion element BR, the eleventh photoelectric conversion element BL, the twelfth photoelectric conversion element BR, the fifteenth photoelectric conversion element BL and the sixteenth photoelectric conversion element BR in the second pixel PX2.

In the cases of FIGS. 27 and 28, the row driver 30 may perform the control to turn on the transmission gates belonging to the readout areas ROA1 and ROA2 and to turn off the transmission gates not belonging to the readout areas ROA1 and ROA2 in the first pixel PX1 and the second pixel PX2, thereby implementing a charge sum. Further, under the premise that the pixel array 10 is read in the unit of a row, when the readout of the readout areas ROA1 and ROA2 illustrated by the thick line in the first row of FIGS. 27 and 28 is completed, the readout areas ROA1 and ROA2 are set in the next row and the readout thereof will subsequently be performed.

Figure 29:
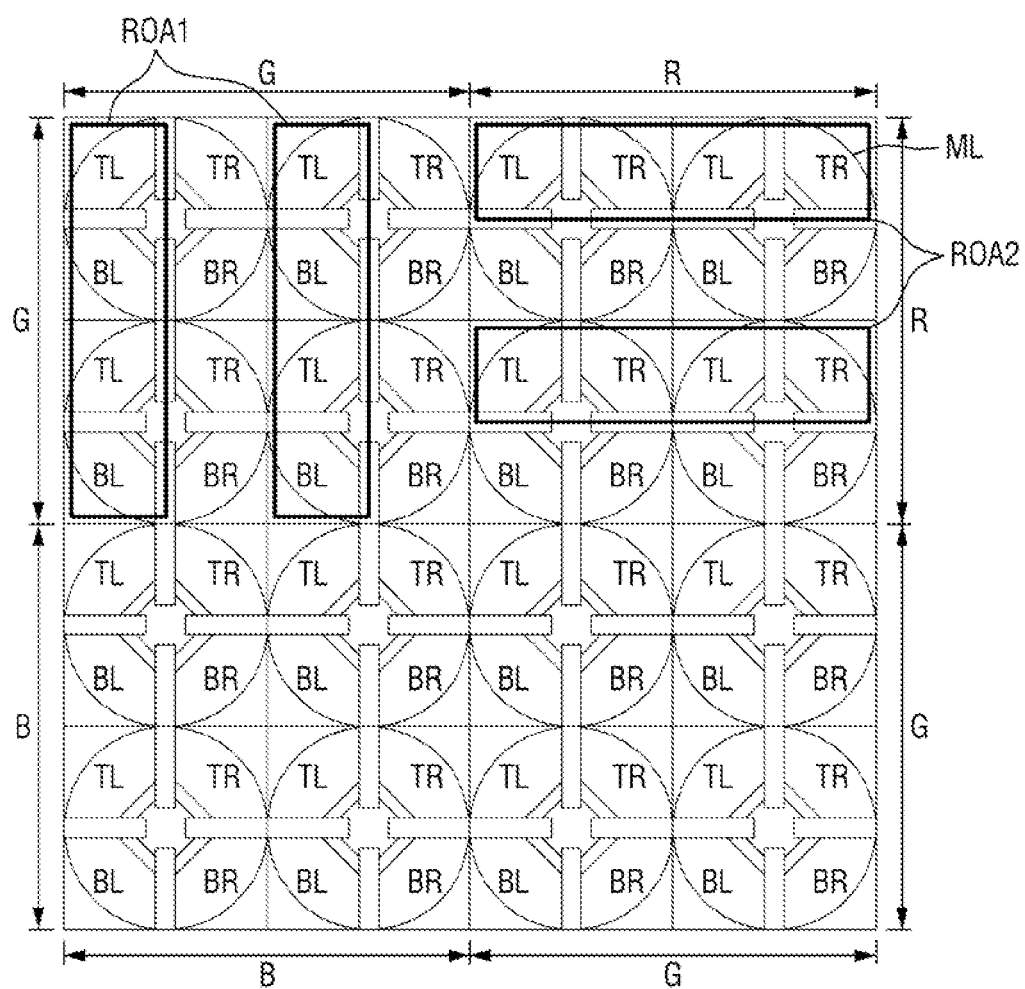
Figure 30:
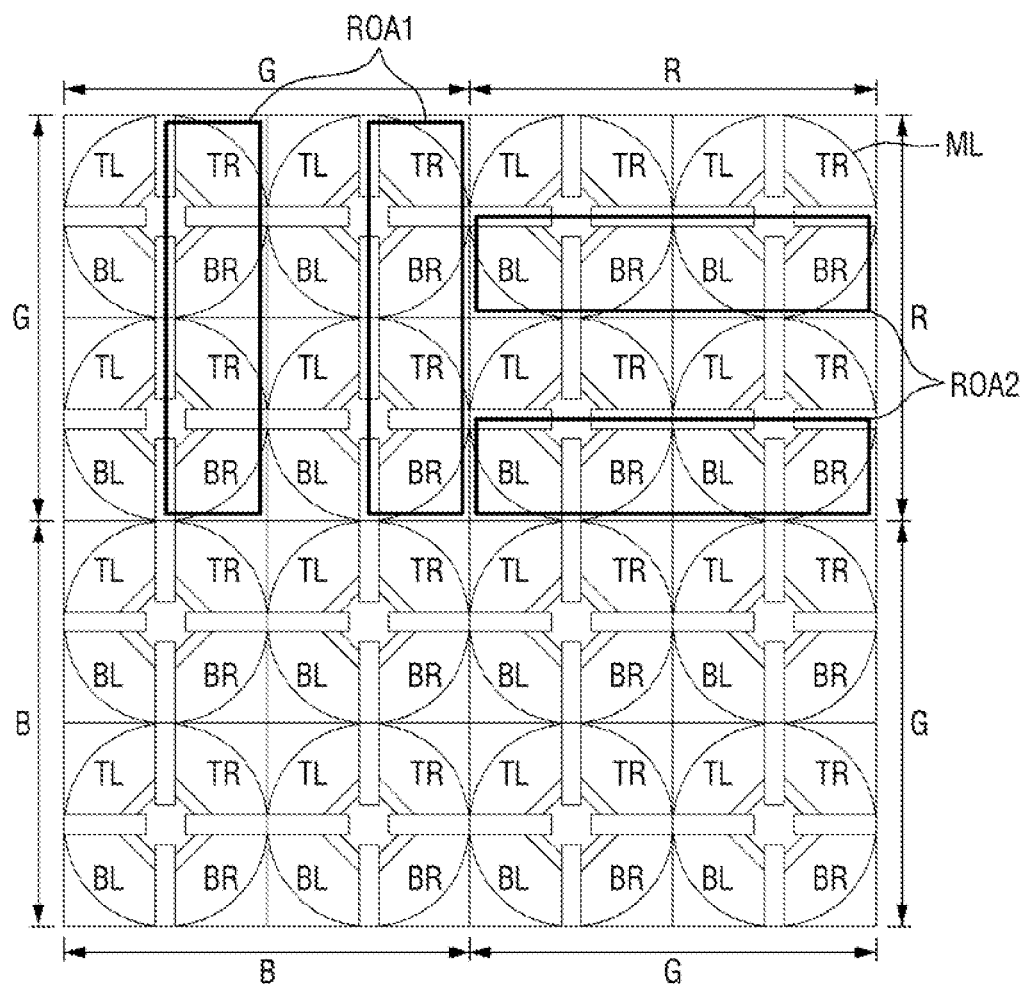
Figure 31:
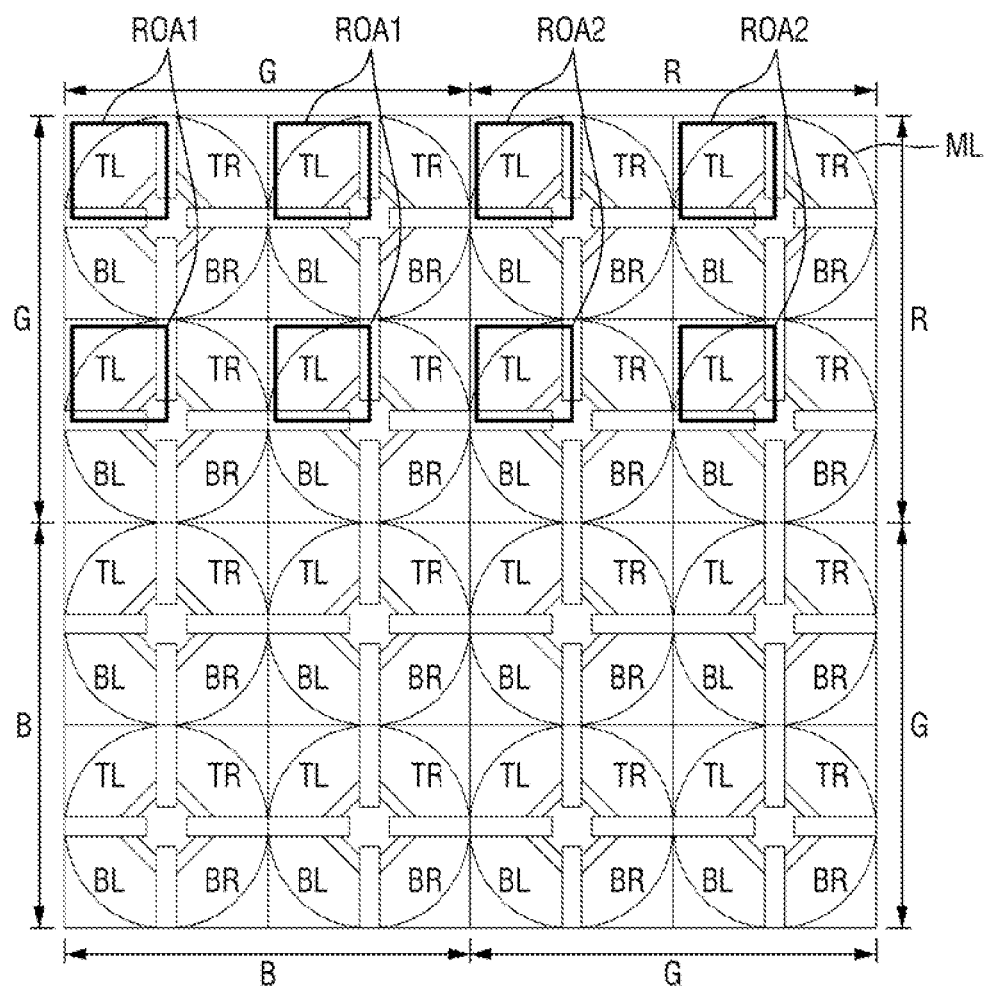

Next, referring to FIGS. 29 and 30, a case where the preset readout mode is a fourth readout mode (or left/right and top/bottom combination mode) is illustrated. First, referring to FIG. 29, the first readout area ROA1 is defined to include the first photoelectric conversion element TL, the third photoelectric conversion element BL, the fifth photoelectric conversion element TL, the seventh photoelectric conversion element BL, the ninth photoelectric conversion element TL, the eleventh photoelectric conversion element BL, the thirteenth photoelectric conversion element TL and the fifteenth photoelectric conversion element BL included in the first pixel PX1. The second readout area ROA2 is defined to include the first photoelectric conversion element TL, the second photoelectric conversion element TR, the fifth photoelectric conversion element TL, the sixth photoelectric conversion element TR, the ninth photoelectric conversion element TL, the tenth photoelectric conversion element TR, the thirteenth photoelectric conversion element TL and the fourteenth photoelectric conversion element TR included in the second pixel PX2.

On the other hand, referring to FIG. 30, the first readout area ROA1 may be defined to include the second photoelectric conversion element TR, the fourth photoelectric conversion element BR, the sixth photoelectric conversion element TR, the eighth photoelectric conversion element BR, the tenth photoelectric conversion element TR, the twelfth photoelectric conversion element BR, the fourteenth photoelectric conversion element TR and the sixteenth photoelectric conversion element BR included in the first pixel PX1. The second readout area ROA2 may be defined to include the third photoelectric conversion element BL, the fourth photoelectric conversion element BR, the seventh photoelectric conversion element BL, the eighth photoelectric conversion element BR, the eleventh photoelectric conversion element BL, the twelfth photoelectric conversion element BR, the fifteenth photoelectric conversion element BL and the sixteenth photoelectric conversion element BR included in the second pixel PX2.

In the cases of FIGS. 29 and 30, the row driver 30 may perform the control to turn on the transmission gates belonging to the readout areas ROA1 and ROA2 and to turn off the transmission gates not belonging to the readout areas ROA1 and ROA2 in the first pixel PX1 and the second pixel PX2, thereby implementing a charge sum. Further, under the premise that the pixel array 10 is read in the unit of a row, when the readout of the readout areas ROA1 and ROA2 illustrated by thick lines in the first row of FIGS. 29 and 30 is completed, the readout areas ROA1 and ROA2 are set in the next row and the readout thereof will subsequently be performed.

Next, referring to FIGS. 31 to 34, a case where the preset readout mode is a fifth readout mode (or additional charge sum mode) is illustrated. First, referring to FIG. 31, the first readout area ROA1 is defined to include the first photoelectric conversion element TL, the fifth photoelectric conversion element TL, the ninth photoelectric conversion element TL, and the thirteenth photoelectric conversion element TL in the first pixel PX1. The second readout area ROA2 is defined to include the first photoelectric conversion element TL, the fifth photoelectric conversion element TL, the ninth photoelectric conversion element TL, and the thirteenth photoelectric conversion element TL in the second pixel PX2.

Figure 32:
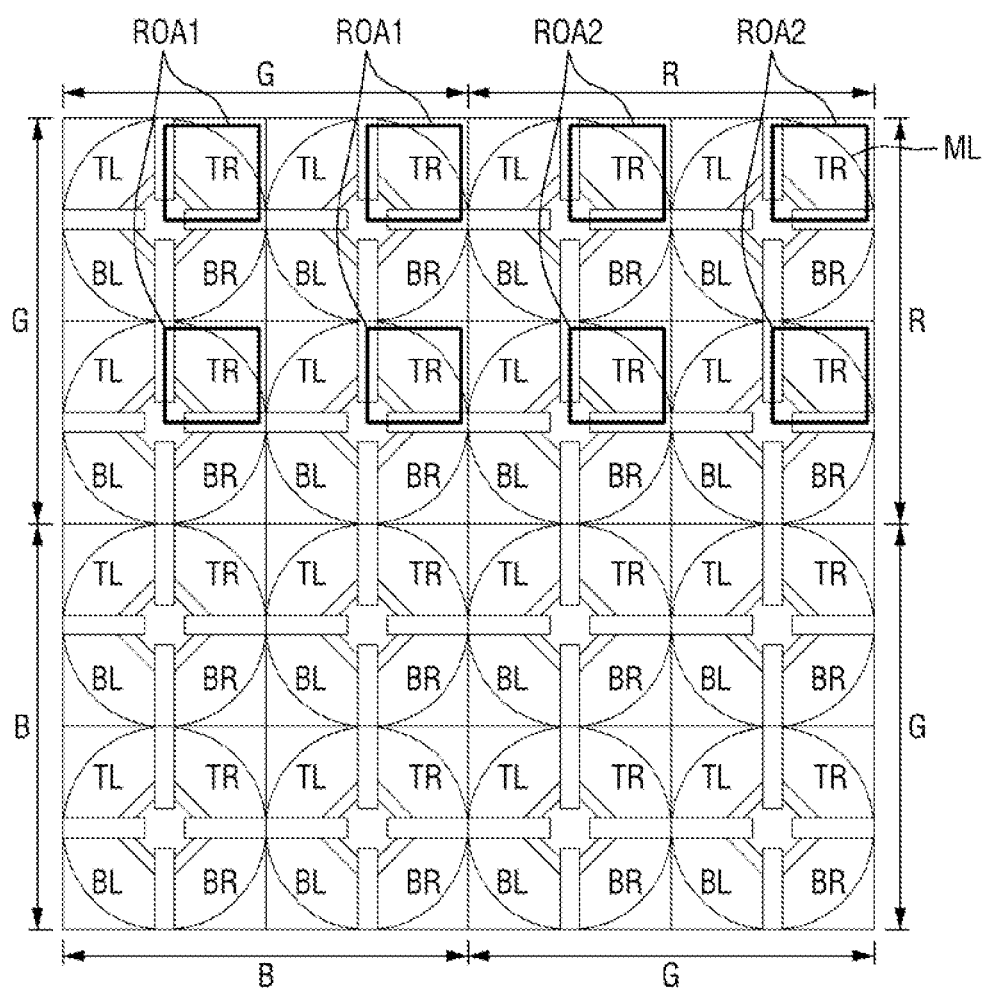

On the other hand, referring to FIG. 32, the first readout area ROA1 may also be defined to include the second photoelectric conversion element TR, the sixth photoelectric conversion element TR, the tenth photoelectric conversion element TR and the fourteenth photoelectric conversion element TR in the first pixel PX1. The second readout area ROA2 may also be defined to include the second photoelectric conversion element TR, the sixth photoelectric conversion element TR, the tenth photoelectric conversion element TR and the fourteenth photoelectric conversion element TR in the second pixel PX.

Figure 33:
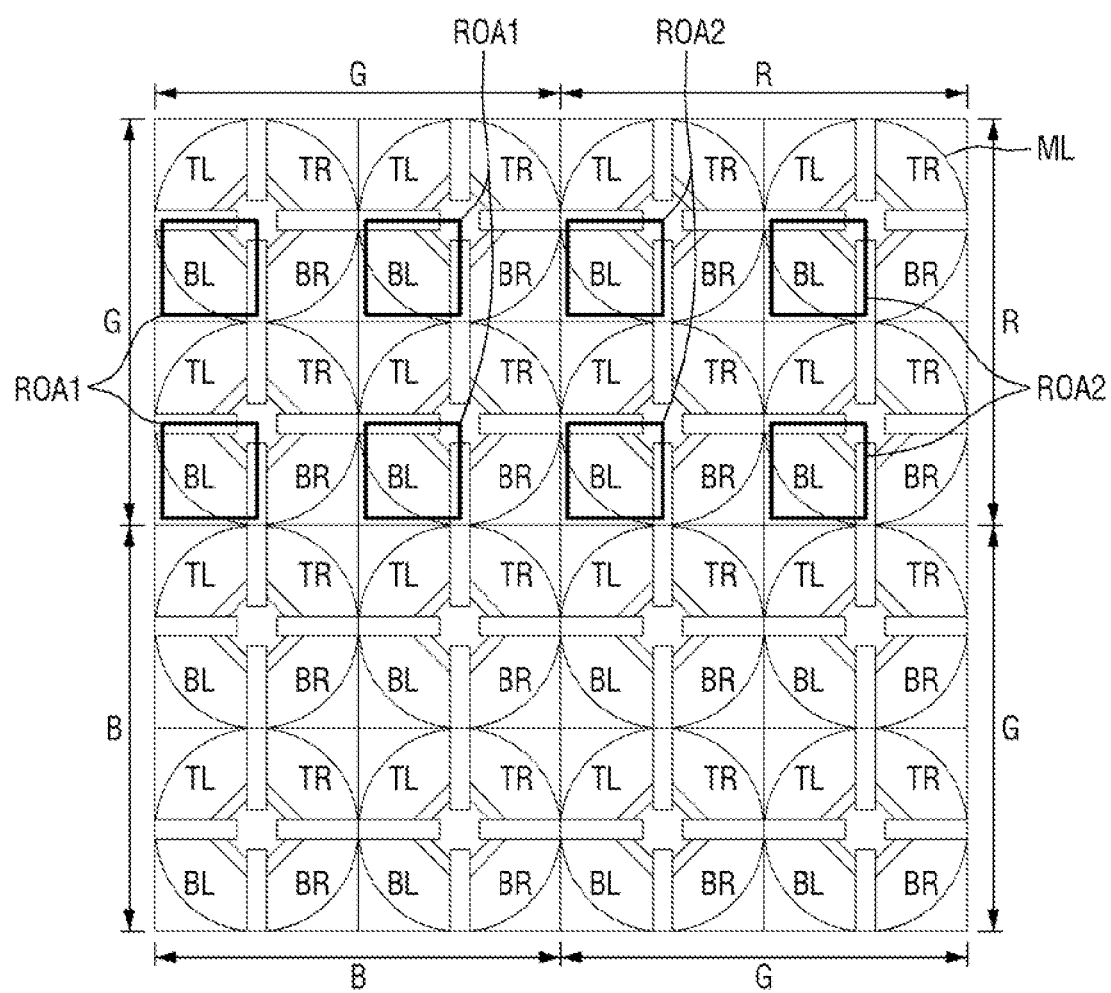

Further, referring to FIG. 33, the first readout area ROA1 may also be defined to include the third photoelectric conversion element BL, the seventh photoelectric conversion element BL, the eleventh photoelectric conversion element BL and the fifteenth photoelectric conversion element BL in the first pixel PX1. The second readout area ROA2 may also be defined to include the third photoelectric conversion element BL, the seventh photoelectric conversion element BL, the eleventh photoelectric conversion element BL and the fifteenth photoelectric conversion element BL in the second pixel PX2.

Figure 34:
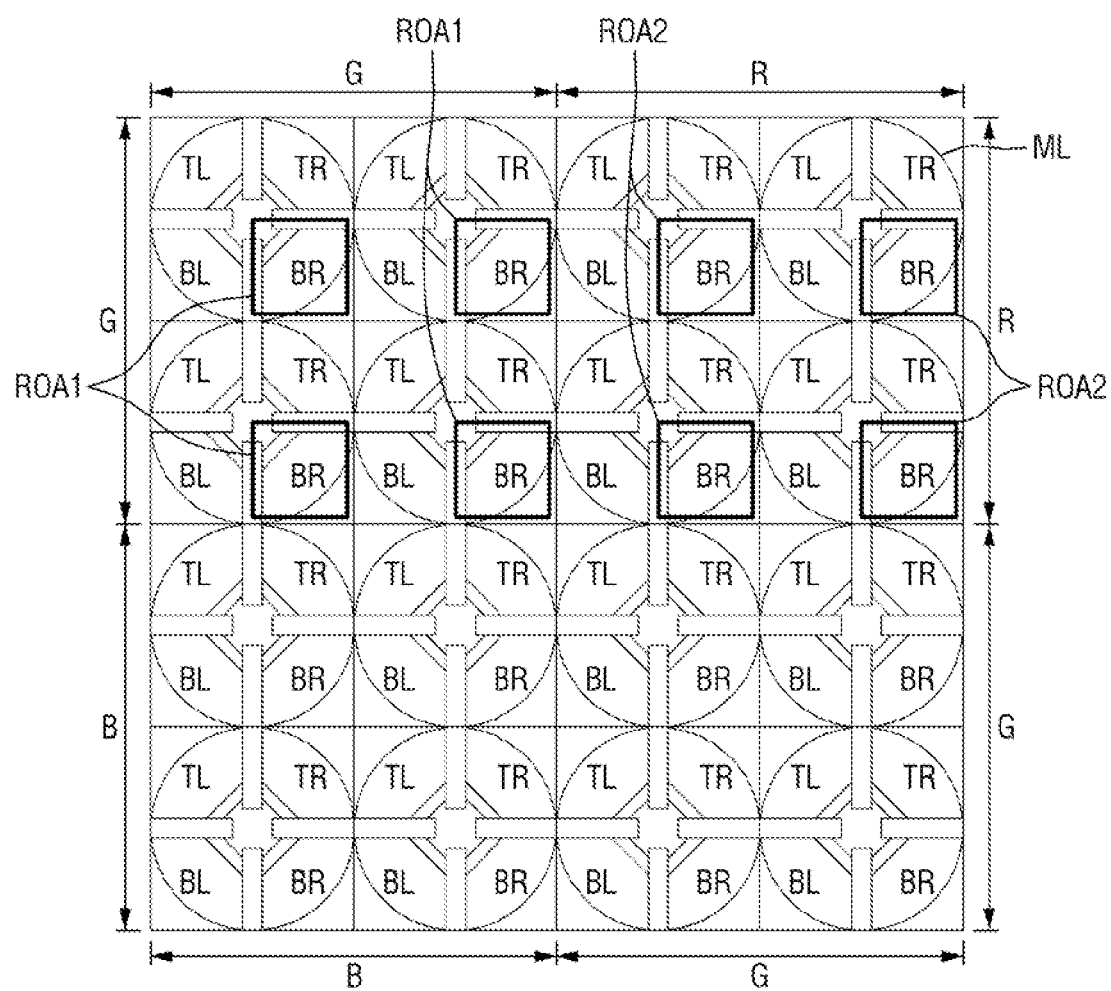

On the other hand, referring to FIG. 34, the first readout area ROA1 may also be defined to include the fourth photoelectric conversion element BR, the eighth photoelectric conversion element BR, the twelfth photoelectric conversion element BR and the sixteenth photoelectric conversion element BR in the first pixel PX1. The second readout area ROA2 may also be defined to include the fourth photoelectric conversion element BR, the eighth photoelectric conversion element BR, the twelfth photoelectric conversion element BR and the sixteenth photoelectric conversion element BR in the second pixel PX2.

In the cases of FIGS. 31 to 34, the row driver 30 may perform the control to turn on the transmission gates belonging to the readout areas ROA1 and ROA2 and to turn off the transmission gates not belonging to the readout areas ROA1 and ROA2 in the first pixel PX1 and the second pixel PX2, thereby implementing a charge sum.

In the detailed description, those skilled in the art will appreciate that many variations and modifications may be made to exemplary embodiments without substantially departing from the principles of the present inventive concept. Therefore, the disclosed exemplary embodiments are used in a generic and descriptive sense only and not for purposes of limitation.

The exemplary embodiments have been described with reference to the attached drawings, but it may be understood by one of ordinary skill in the art that exemplary embodiments may be performed one of ordinary skill in the art in other specific forms without changing the technical concept or essential features of the present inventive concept. Further, the above-described exemplary embodiments are merely examples and do not limit the scope of the rights of the present inventive concept.

What is claimed is:

1. An image sensor comprising:
a pixel array including a first pixel to a fourth pixel arranged along rows and columns; and
a row driver,
wherein each of the first pixel to the fourth pixel includes a first sub-pixel to a fourth sub-pixel and sharing a same color filter,
wherein each of the first sub-pixel to the fourth sub-pixel includes a first photoelectric conversion element to a fourth photoelectric conversion element sharing a floating diffusion area with each other, a first transmission gate to a fourth transmission gate for providing signals provided from the first photoelectric conversion element to the fourth photoelectric conversion element to the floating diffusion area, and a micro lens disposed to overlap the first photoelectric conversion element to the fourth photoelectric conversion element,
wherein the first photoelectric conversion element is disposed in a first row and a first column, the second photoelectric conversion element is disposed in the first row and a second column, the third photoelectric conversion element is disposed in a second row and the first column, and the fourth photoelectric conversion element is disposed in the second row and the second column, in each of the first sub-pixel to the fourth sub-pixel,
wherein for a first readout mode, the row driver is configured to turn on the first transmission gate to the fourth transmission gate sharing the floating diffusion area, and
wherein for a second readout mode, the row driver is configured to turn on some of the first transmission gate to the fourth transmission gate sharing the floating diffusion area at a first time, and turn on the others of the first transmission gate to the fourth transmission gate sharing the floating diffusion area at a second time different from the first time.

2. The image sensor of claim 1, wherein for the second readout mode, the row driver is configured to
turn on the first transmission gate and the third transmission gate sharing the floating diffusion area at the first time, and
turn on the second transmission gate and the fourth transmission gate sharing the floating diffusion area at the second time.

3. The image sensor of claim 1, wherein for the second readout mode, the row driver is configured to
turn on the first transmission gate and the second transmission gate sharing the floating diffusion area at the first time, and
turn on the third transmission gate and the fourth transmission gate sharing the floating diffusion area at the second time.

4. The image sensor of claim 1, wherein for the first readout mode, the row driver is configured to turn on the first transmission gate to the fourth transmission gate sharing the floating diffusion area in the first sub-pixel, and the first transmission gate to the fourth transmission gate sharing the floating diffusion area in the second sub-pixel, and
wherein for the second readout mode, the row driver is configured to
turn on the first transmission gate and the third transmission gate in the first sub-pixel and the first transmission gate and the second transmission gate in the second sub-pixel at the first time, and
turn on the second transmission gate and the fourth transmission gate in the first sub-pixel and the third transmission gate and the fourth transmission gate in the second sub-pixel at the second time.

5. The image sensor of claim 1, wherein for the second readout mode, the row driver is configured to
turn to two transmission gates among the first transmission gate to the fourth transmission gate in sharing the floating diffusion area at the first time, and
turn to the others among the first transmission gate to the fourth transmission gate sharing the floating diffusion area at the second time.

6. The image sensor of claim 1,
wherein the first pixel includes a first filter for sensing light of one first color band,
wherein the second pixel includes a second filter for sensing light of one second color band different from the one first color band,
wherein the third pixel includes a third filter for sensing light of one third color band different from the one first color band, and
wherein the fourth pixel includes a fourth filter for sensing light of one fourth color band different from the one second color band to the one third color band.

7. The image sensor of claim 1, wherein the row driver is configured to sum signals provided to the floating diffusion area from turned on transmission gates among the first transmission gate to the fourth transmission gate sharing the floating diffusion area.

8. An image sensor comprising:
a pixel array including a first pixel to a fourth pixel arranged along rows and columns; and a row driver, wherein each of the first pixel to the fourth pixel includes a first sub-pixel to a fourth sub-pixel and sharing a same color filter, wherein each of the first sub-pixel to the fourth sub-pixel includes a first photoelectric conversion element to a fourth photoelectric conversion element sharing a floating diffusion area with each other, a first transmission gate to a fourth transmission gate for providing signals provided from the first photoelectric conversion element to the fourth photoelectric conversion element to the floating diffusion area, and a micro lens disposed to overlap the first photoelectric conversion element to the fourth photoelectric conversion element, wherein the first photoelectric conversion element is disposed in a first row and a first column, the second photoelectric conversion element is disposed in the first row and a second column, the third photoelectric conversion element is disposed in a second row and the first column, and the fourth photoelectric conversion element is disposed in the second row and the second column, in each of the first sub-pixel to the fourth sub-pixel, wherein the first photoelectric conversion element to the fourth photoelectric conversion element in the first sub-pixel and the first photoelectric conversion element to the fourth photoelectric conversion element in the third sub-pixel share a first floating diffusion area, wherein for a first readout mode, the row driver is configured to turn on the first transmission gate to the fourth transmission gate in the first sub-pixel and the first transmission gate to the fourth transmission gate in the third sub-pixel, sharing the first floating diffusion area, and wherein for a second readout mode, the row driver is configured to turn on some of the first transmission gate to the fourth transmission gate in the first sub-pixel and the first transmission gate to the fourth transmission gate in the third sub-pixel, sharing the first floating diffusion area, at a first time, and turn on the others of the first transmission gate to the fourth transmission gate in the first sub-pixel and the first transmission gate to the fourth transmission gate in the third sub-pixel, sharing the first floating diffusion area, at a second time different from the second time.

9. The image sensor of claim 8, wherein for the second readout mode, the row driver is configured to turn on the first transmission gate and the third transmission gate in the first sub-pixel, and the first transmission gate and the third transmission gate in the third sub-pixel, sharing the first floating diffusion area, at the first time, and turn on the second transmission gate and the fourth transmission gate in the first sub-pixel and the second transmission gate and the fourth transmission gate in the third sub-pixel, sharing the first floating diffusion area, at the second time.

10. The image sensor of claim 8, wherein for the second readout mode, the row driver is configured to turn on the first transmission gate and the second transmission gate in the first sub-pixel, and the first transmission gate and the second transmission gate in the third sub-pixel, sharing the first floating diffusion area, at the first time, and turn on the third transmission gate and the fourth transmission gate in the first sub-pixel and the third transmission gate and the fourth transmission gate in the third sub-pixel, sharing the first floating diffusion area, at the second time.

11. The image sensor of claim 8, wherein the first photoelectric conversion element to the fourth photoelectric conversion element in the second sub-pixel and the first photoelectric conversion element to the fourth photoelectric conversion element in the fourth sub-pixel share a second floating diffusion area, wherein for the first readout mode, the row driver is configured to further turn on the first transmission gate to the fourth transmission gate in each of the second sub-pixel and the fourth sub-pixel, sharing the second floating diffusion area, and wherein for the second readout mode, the row driver is configured to turn on the first transmission gate and the third transmission gate in each of the first sub-pixel and the third sub-pixel, sharing the first floating diffusion area, and the first transmission gate and the second transmission gate in each of the second sub-pixel and the fourth sub-pixel, sharing the second floating diffusion area, at the first time, and turn on the second transmission gate and the fourth transmission gate in each of the first sub-pixel and the third sub-pixel, sharing the first floating diffusion area, and the third transmission gate and the fourth transmission gate in each of the second sub-pixel and the fourth sub-pixel, sharing the second floating diffusion area, at the second time.

12. The image sensor of claim 8, wherein for the second readout mode, the row driver is configured to turn on four transmission gates among the first transmission gate to the fourth transmission gate in each of the first sub-pixel and the third sub-pixel, sharing the first floating diffusion area, at the first time, and turn on the others among the first transmission gate to the fourth transmission gate in each of the first sub-pixel and the third sub-pixel, sharing the first floating diffusion area, at the second time.

13. The image sensor of claim 8, wherein the first pixel includes a first filter for sensing light of one first color band, wherein the second pixel includes a second filter for sensing light of one second color band different from the one first color band, wherein the third pixel includes a third filter for sensing light of one third color band different from the one first color band, and wherein the fourth pixel includes a fourth filter for sensing light of one fourth color band different from the one second color band to the one third color band.

14. The image sensor of claim 8, wherein the first photoelectric conversion element to the fourth photoelectric conversion element in the second sub-pixel and the first photoelectric conversion element to the fourth photoelectric conversion element in the fourth sub-pixel share a second floating diffusion area, and wherein for a third readout mode, the row driver is configured to turn on the first transmission gate in each of the first sub-pixel to the fourth sub-pixel at a third time, turn on the second transmission gate in each of the first sub-pixel to the fourth sub-pixel at a fourth time different from the third time, turn on the third transmission gate in each of the first sub-pixel to the fourth sub-pixel at a fifth time different from the fourth time, and turn on the fourth transmission gate in each of the first sub-pixel to the fourth sub-pixel at a sixth time different from the fifth time.

15. An image sensor comprising:

a pixel array including a first pixel to a fourth pixel arranged along rows and columns; and a row driver, wherein each of the first pixel to the fourth pixel includes a first sub-pixel to a fourth sub-pixel and sharing a same color filter, wherein each of the first sub-pixel to the fourth sub-pixel includes a first photoelectric conversion element to a fourth photoelectric conversion element sharing a floating diffusion area with each other, a first transmission gate to a fourth transmission gate for providing signals provided from the first photoelectric conversion element to the fourth photoelectric conversion element to the floating diffusion area, and a micro lens disposed to overlap the first photoelectric conversion element to the fourth photoelectric conversion element, wherein the first photoelectric conversion element is disposed in a first row and a first column, the second photoelectric conversion element is disposed in the first row and a second column, the third photoelectric conversion element is disposed in a second row and the first column, and the fourth photoelectric conversion element is disposed in the second row and the second column, in each of the first sub-pixel to the fourth sub-pixel, wherein the first photoelectric conversion element to the fourth photoelectric conversion element in each of the first sub-pixel to the fourth sub-pixel share a first floating diffusion area, wherein for a first readout mode, the row driver is configured to turn on the first transmission gate to the fourth transmission gate in each of the first sub-pixel to the fourth sub-pixel, sharing the first floating diffusion area, and wherein for a second readout mode, the row driver is configured to turn on some of the first transmission gate to the fourth transmission gate in each of the first sub-pixel to the fourth sub-pixel, sharing the first floating diffusion area, at a first time, and turn on the others of the first transmission gate to the fourth transmission gate in each of the first sub-pixel to the fourth sub-pixel, sharing the first floating diffusion area, at a second time different from the first time.

16. The image sensor of claim 15, wherein for the second readout mode, the row driver is configured to turn on the first transmission gate and the third transmission gate in each of the first sub-pixel to the fourth sub-pixel, sharing the first floating diffusion area, at the first time, and turn on the second transmission gate and the fourth transmission gate in each of the first sub-pixel to the fourth sub-pixel, sharing the first floating diffusion area, at the second time.

17. The image sensor of claim 15, wherein for the second readout mode, the row driver is configured to turn on the first transmission gate and the second transmission gate in each of the first sub-pixel to the fourth sub-pixel, sharing the first floating diffusion area, at the first time, and turn on the third transmission gate and the fourth transmission gate in each of the first sub-pixel to the fourth sub-pixel, sharing the first floating diffusion area, at the second time.

18. The image sensor of claim 15, wherein for the first readout mode, the row driver is configured to turn on the first transmission gate to the fourth transmission gate in each of the first sub-pixel to the fourth sub-pixel in the first pixel, and the first transmission gate to the fourth transmission gate in each of the first sub-pixel to the fourth sub-pixel in the second pixel, and wherein for the second readout mode, the row driver is configured to turn on the first transmission gate and the third transmission gate in each of the first sub-pixel to the fourth sub-pixel in the first pixel, and the first transmission gate and the second transmission gate in each of the first sub-pixel to the fourth sub-pixel in the second pixel at the first time, and turn on the second transmission gate and the fourth transmission gate in each of the first sub-pixel to the fourth sub-pixel in the first pixel, and the third transmission gate and the fourth transmission gate in each of the first sub-pixel to the fourth sub-pixel in the second pixel at the second time.

19. The image sensor of claim 15, wherein for the first readout mode, the row driver is configured to turn on the first transmission gate to the fourth transmission gate in each of the first sub-pixel to the fourth sub-pixel in the first pixel, and the first transmission gate to the fourth transmission gate in each of the first sub-pixel to the fourth sub-pixel in the second pixel, and wherein for a third readout mode, the row driver is configured to turn on the first transmission gate in each of the first sub-pixel to the fourth sub-pixel in the first pixel, and the first transmission gate in each of the first sub-pixel to the fourth sub-pixel in the second pixel at a third time, turn on the second transmission gate in each of the first sub-pixel to the fourth sub-pixel in the first pixel, and the second transmission gate in each of the first sub-pixel to the fourth sub-pixel in the second pixel at a fourth time different from the third time, turn on the third transmission gate in each of the first sub-pixel to the fourth sub-pixel in the first pixel, and the third transmission gate in each of the first sub-pixel to the fourth sub-pixel in the second pixel at a fifth time different from the fourth time, and turn on the fourth transmission gate in each of the first sub-pixel to the fourth sub-pixel in the first pixel, and the fourth transmission gate in each of the first sub-pixel to the fourth sub-pixel in the second pixel at a sixth time different from the fifth time.

20. The image sensor of claim 15, wherein for the second readout mode, the row driver is configured to turn to eight transmission gates among the first transmission gate to the fourth transmission gate in the first sub-pixel and the first transmission gate to the fourth transmission gate in the third sub-pixel at the first time, and turn to the others among the first transmission gate to the fourth transmission gate in the first sub-pixel and the first transmission gate to the fourth transmission gate in the third sub-pixel at the second time.

* * * * *